(12) United States Patent
Cho et al.

(10) Patent No.: US 7,044,201 B2
(45) Date of Patent: May 16, 2006

(54) FLAT HEAT TRANSFERRING DEVICE AND METHOD OF FABRICATING THE SAME

(75) Inventors: Kyung-il Cho, Seoul (KR); Byeoung-ju Ha, Yongin (KR); Young-ki Hong, Anyang (KR); Tae-gyun Kim, Suwon (KR); Jong-beom Kim, Anyang (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 279 days.

(21) Appl. No.: 10/645,116

(22) Filed: Aug. 21, 2003

(65) Prior Publication Data

US 2004/0040696 A1 Mar. 4, 2004

(30) Foreign Application Priority Data

Aug. 21, 2002 (KR) .............................. 2002-49426
Apr. 9, 2003 (KR) ..................... 10-2003-0022218

(51) Int. Cl.
*F28F 15/00* (2006.01)

(52) U.S. Cl. ........................ 165/104.26; 165/104.33; 165/80.4; 361/700; 361/697; 174/15.2; 257/715

(58) Field of Classification Search ........... 165/104.33, 165/104.21, 104.19, 104.26, 80.4; 361/699, 361/700; 174/15.2; 257/714–716
See application file for complete search history.

(56) References Cited

U.S. PATENT DOCUMENTS 3,749,159 A * 7/1973 Meijer ................... 165/104.26
3,820,596 A * 6/1974 Weinhardt et al. ..... 165/104.26
4,899,812 A * 2/1990 Altoz ....................... 165/109.1
5,346,000 A * 9/1994 Schlitt ................... 165/104.26
5,725,049 A * 3/1998 Swanson et al. ....... 165/104.26
6,167,948 B1 * 1/2001 Thomas ................. 165/104.26
6,227,287 B1 * 5/2001 Tanaka et al. ............. 165/80.4
6,269,866 B1 * 8/2001 Yamamoto et al. .... 165/104.26
6,397,935 B1 * 6/2002 Yamamoto et al. .... 165/104.26
6,698,503 B1 * 3/2004 Son et al. .............. 165/104.26
2002/0020518 A1 * 2/2002 Li .......................... 165/104.11
2002/0056542 A1 * 5/2002 Yamamoto et al. ........ 165/80.3
2003/0024691 A1 * 2/2003 Tsay et al. ............. 165/104.26

FOREIGN PATENT DOCUMENTS

JP 2001-255085 * 9/2001 ............ 165/104.33

* cited by examiner

*Primary Examiner*—Terrell McKinnon
(74) *Attorney, Agent, or Firm*—Sughrue Mion, PLLC

(57) ABSTRACT

A substantially flat heat transferring device and a method of fabricating the same are provided. The device includes a lower plate, an upper plate, a wick plate, and a liquid-phase coolant, while the lower plate contacts a heat source at its bottom. The upper plate is hermetically coupled with the lower plate along its edge to form a void therebetween. The wick plate is provided between the upper plate and the lower plate and is maintained in position relative to the lower plate by surface tension of the liquid-phase coolant. The liquid-phase coolant transfers heat by circulating between a vaporization part, where the heat source is located, to a condensing part. Here, the wick plate includes a plurality of holes and a plurality of planar wicks and makes the liquid-phase coolant flow from the condensing part to the vaporization part by capillary force between itself and the lower plate.

121 Claims, 28 Drawing Sheets

FLAT HEAT TRANSFERRING DEVICE AND METHOD OF FABRICATING THE SAME

BACKGROUND OF THE INVENTION

This application claims the priority of Korean Patent Application Nos. 2002-49426 and 2003-22218 filed on Aug. 21, 2002 and Apr. 9, 2003, respectively, in the Korean Intellectual Property Office, the disclosures of which are incorporated herein in their entirety by reference.

1. Field of the Invention

The present invention relates to small sized heat transferring device, and more particularly, to a substantially flat heat transferring device for cooling high heat-generating chips.

2. Description of the Related Art

Due to the rapid development in semiconductor techniques and methods of manufacturing semiconductor devices, ultra-slim electronic devices (e.g., laptop computers), which show much greater performance having smaller thickness and volume, have become widely used.

In such ultra slim electronic devices, it is very important to cool high heat-generating elements having a higher calorific power, such as a CPU chip installed in a computer, as well as the entire device. Most of the high heat-generating elements in an electronic device are considered important to the operation of the entire device. Specifically, unless heat generated from such high heat-generating elements is removed as soon as possible, the functions of the high heat-generating elements may be considerably degraded. In an even worse case, the heat-generating elements may be damaged, in which case the entire device may not operate at all.

In recent years, with an increasing awareness of how important cooling of high heat-generating elements is, various coolers for cooling high heat-generating elements have been suggested.

FIGS. 1 through 3 are cross-sectional views of conventional cylindrical heat pipes. In particular, FIG. 1 shows a cylindrical heat pipe 10 inside of which a groove 12 is formed. FIG. 2 shows a cylindrical heat pipe 20 inside of which a sintered metal 22 is provided. FIG. 3 shows a cylindrical heat pipe 30 inside of which a mesh screen 32 is provided.

Referring to FIG. 1, vapor, which is vaporized by heat generated from a heat source (not shown), is transferred to a condensing part (not shown) via a hollow 14 in the heat pipe 10. A liquid-phase coolant provided from the condensing part is fed back to a vaporization part (not shown) through the groove 12.

Hollows 24 and 34 shown in FIGS. 2 and 3, respectively, have the same function as the hollow 14 shown in FIG. 1. In addition, the sintered metal 22 and the mesh screen 32 shown in FIGS. 2 and 3, respectively, correspond to the groove 12 shown in FIG. 1 in terms of function.

As shown in FIG. 4, a vaporization part 44 is located at one end of a cylindrical heat pipe 40 to contact a heat source, and a condensing part 48 for compressing vapor is located at the other end of the cylindrical heat pipe 40. Reference numeral 46 represents a vapor pathway which is connected between the vaporization part 44 and the condensing part 48. Arrows in the heat pipe 40 represent the direction of the movement of a coolant. Vapor entering the condensing part 48 through the vapor pathway 46 changes into a liquid-phase coolant. The liquid-phase coolant permeates a porous material 42 provided inside the heat pipe 40 and moves to the vaporization part 44 due to capillary action in the porous material 42. The cylindrical heat pipes shown in FIGS. 1 through 3 include the groove 12, the sintered metal 22, and the mesh screen 32, respectively, instead of the porous material 42.

The cylindrical heat pipes shown in FIGS. 1 through 3 can be used for ultra slim electronic devices (e.g., laptop computers), but the heat pipes must be pressed to have a smaller thickness and must be bent to increase the area of heat transmission of a fan in the condensing part 48.

However, it is hard to bend a heat pipe pressed to have such a small thickness, and even if the heat pipe can be bent, capillary means provided inside of the heat pipe are physically deformed by the bending, therefore downgrading the performance of the heat pipe.

Additionally, a wick structure provided inside each of the cylindrical heat pipes shown in FIGS. 1 through 3 can be applied to an ultra slim heat pipe. However, in the case of applying the groove 12 shown in FIG. 1 to such an ultra slim heat pipe, the manufacturing costs of the heat pipe increase because it is very difficult to form a fine groove in an ultra slim heat pipe. Alternatively, if the sintered metal 22 shown in FIG. 2 or the mesh screen 32 shown in FIG. 3 is applied to the wick structure of an ultra slim heat pipe, the decrease in flow pressure becomes greater (because the wick layer gets thinner). In addition, because the size of pores is irregular, the surface tension of a coolant weakens. Thus, the cooling efficiency of the heat pipe is lowered.

SUMMARY OF THE INVENTION

The present invention provides a substantially flat heat transferring device having a wick structure suitable for an ultra slim electronic device, which has reduced manufacturing costs and exhibits a small vaporization heat resistance. The present invention also provides a method of fabricating the substantially flat heat transferring device.

According to one aspect of the present invention, there is provided a substantially flat heat transferring device, which includes a vaporization part where a liquid-phase coolant is vaporized and a condensing part where vapor generated in the vaporization part condenses into liquid, the liquid-phase coolant moving from the condensing part to the vaporization part by capillary force. The substantially flat heat transferring device includes a lower plate, an upper plate, a wick plate, and a liquid-phase coolant. The lower plate contacts a heat source at its bottom. The upper plate is hermetically coupled with the lower plate along its edge to form a void therebetween. The wick plate is provided between the upper plate and the lower plate and is maintained in position relative to the lower plate by surface tension of the liquid-phase coolant. The liquid-phase coolant transfers heat transferred from the heat source from the vaporization part to the condensing part circulating between the vaporization part and the condensing part. Here, the wick plate includes a plurality of holes and a plurality of planar wicks and makes the liquid-phase coolant flow from the condensing part to the vaporization part by capillary force between itself and the lower plate.

In another aspect of the invention, the upper plate is embossed to have recessed parts and raised parts, and the recessed parts, which are parts raised toward the wick plate, of the upper plate contact some of the planar wicks to maintain the wick plate in position relative to the lower plate.

In another aspect of the invention, the substantially flat heat transferring device further includes vertical spacers, which are formed at the inner sidewalls of the upper plate to form a gap between the upper plate and elements surrounded by the upper plate.

In another aspect of the invention, the height of the spacer protrusions extending from the spacer integrated lower plate gradually decreases over the spacer integrated lower plate ranging from the condensing part to the vaporization part.

In another aspect of the invention, the height of the spacer protrusions extending from the spacer integrated lower plate gradually decreases over the spacer integrated lower plate ranging from the condensing part to the vaporization part.

In another aspect of the invention, protrusions, which contact the upper plate, are extended from the wick plate so as to make the wick plate firmly contact the lower plate.

In another aspect of the invention, micropatterns are formed on the surface of the lower plate, having a smaller width than the planar wicks.

According to another aspect of the present invention, there is provided a method of fabricating a substantially flat heat transferring device which includes a vaporization part where a liquid-phase coolant is vaporized and a condensing part where vapor generated in the vaporization part condenses into liquid, the liquid-phase coolant moving from the condensing part to the vaporization part by capillary force. The method involves (1) forming a lower plate, the bottom surface of which contacts a heat source, (2) forming an upper plate corresponding to the lower plate so that a vapor moving space can be formed between elements mounted in the lower plate and the upper plate when coupling the lower plate with the upper plate, (3) forming a wick plate having a plurality of planar wicks and a plurality of holes for making the liquid-phase coolant move from the condensing part to the vaporization part, (4) mounting the wick plate in a predetermined region of the lower plate, (5) arranging the upper plate over the lower plate in which the wick plate is mounted, (6) coupling the upper plate with the lower plate, and (7) injecting a liquid-phase coolant between the coupled upper plate and the lower plate.

In another aspect of the invention, in step (1), the predetermined region of the lower plate is recessed to a predetermined depth for installment of the wick plate.

In another aspect of the invention, in step (3), wick plate protrusions are formed on the wick plate toward the upper plate so that they can be integrated into one body with the wick plate.

In another aspect of the invention, in step (2), protrusions are formed at one among parts of the upper plate corresponding to the vaporization part and the condensing part so as to maintain the wick plate in position relative to the lower plate.

In another aspect of the invention, the method further includes forming a spacer plate having a plurality of spacers for uniformly maintaining a gap between the wick plate and the lower plate and installing the spacer plate between the wick plate and the lower plate.

In another aspect of the invention, the plurality of spacers have a gradually decreasing height so that their height is larger in the condensing part than in the vaporization part.

In another aspect of the invention, the method further includes forming an elastic element for maintaining the wick plate in position relative to the lower plate and installing the elastic element between the upper plate and the wick plate.

In another aspect of the invention, in the formation of the wick plate, a bridge is formed between at least some of the plurality of planar wicks.

In another aspect of the invention, protrusions are formed at an inner surface facing the lower plate of one selected from the planar wicks.

In another aspect of the invention, a spacer bridge is formed between at least some of the plurality of spacers.

In another aspect of the invention, in step (3), the plurality of planar wicks or the plurality of holes are formed using wet etching, dry etching, or punching.

In another aspect of the invention, in step (6), the upper and lower plates are coupled using welding, brazing, electrostatic coupling, or thermal coupling.

In another aspect of the invention, the plurality of planar wicks or holes are arranged in a straight-line pattern, a radial pattern, or a mesh pattern.

In another aspect of the invention, the upper plate corresponding to the vaporization part and the condensing part is embossed to have recessed regions and raised regions so that the vapor can smoothly move and the recessed regions protruded toward the wick plate contact at least some of the plurality of planar wicks.

In another aspect of the invention, micropatterns are formed on the surface of the lower plate so as to expand the surface area of the lower plate.

In another aspect of the invention, spacer protrusions are formed on the lower plate, protruding upward so that they can be integrated into one body with the lower plate.

In another aspect of the invention, the height of spacer protrusions gradually decreases over the lower plate ranging from the condensing part to the vaporization part.

In another aspect of the invention, a region of the lower plate on which the wick plate is to be mounted is covered with a hydrophilic film before mounting the wick plate on the lower plate.

In another aspect of the invention, vertical spacers are formed at the inner sidewalls of the upper plate so as to form a gap between the upper plate and the wick plate.

In another aspect of the invention, the method further includes forming a material layer of a different material from the material of the upper plate on the inner surface of the upper plate.

In another aspect of the invention, the method further includes comprising forming a material layer of a different material from the material of the lower plate on the entire surface of the lower plate, facing the upper plate.

The substantially flat heat-transferring device according to the present invention can be easily applied to a variety of super-slim products, such as laptop computers, and is capable of enhancing the efficiency of cooling down heat generating devices.

BRIEF DESCRIPTION OF THE DRAWINGS

The above objects and advantages of the present invention will become more apparent by describing in detail exemplary embodiments thereof with reference to the attached drawings in which:

FIGS. 10, 12, 13, 15 through 20, and 22 through 25 are cross-sectional views of exemplary embodiments of elements provided between upper and lower plates of the substantially flat heat transferring device shown in FIG. 5, taken along a direction perpendicular to a vaporization part;

FIGS. 11A, 14, 16, and 21 are perspective views of the elements shown in FIGS. 10, 13, 15, and 20, respectively;

FIGS. 31 through 33A, and 33B are cross-sectional views of various exemplary embodiments of a substantially flat heat transferring devices according to the present invention which are different from one another in terms of the position of a heat sink;

DETAILED DESCRIPTION OF ILLUSTRATIVE, NON-LIMITING EMBODIMENTS

Figure 1:
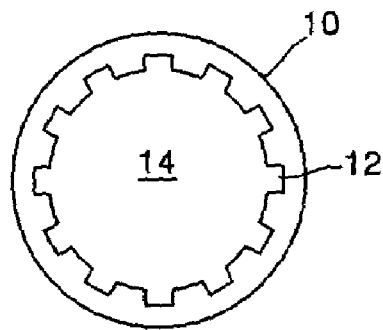
FIGS. 1 through 3 are cross-sectional views of conventional heat pipes, taken perpendicular to the direction of their length.
Figure 2:
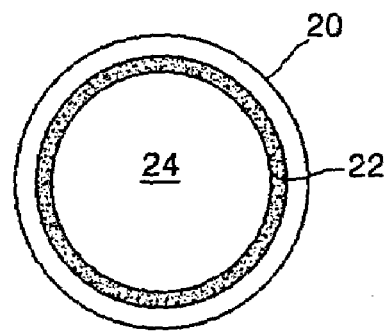
Figure 3:
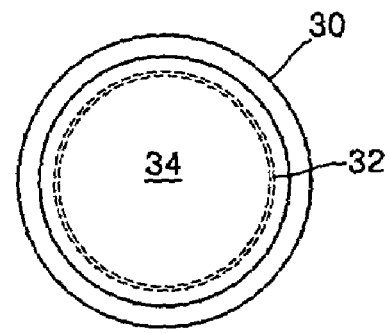
Figure 4:
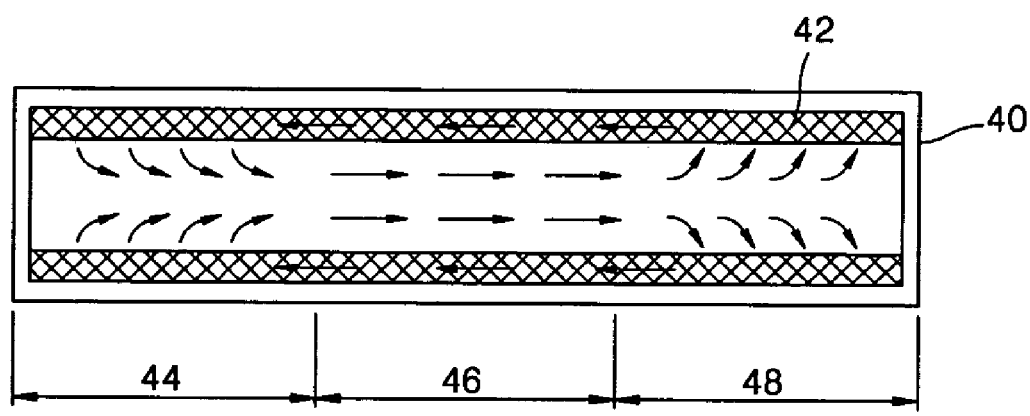
FIG. 4 is a cross-sectional view of a conventional heat pipe, taken along the direction of the length of the heat pipe.

Hereinafter, exemplary embodiments of a substantially flat heat transferring device and a method of fabricating the same according to the present invention will be described in greater detail with reference to the accompanying drawings. In the drawings, the thicknesses of layers and regions are exaggerated for clarity.

Figure 5:
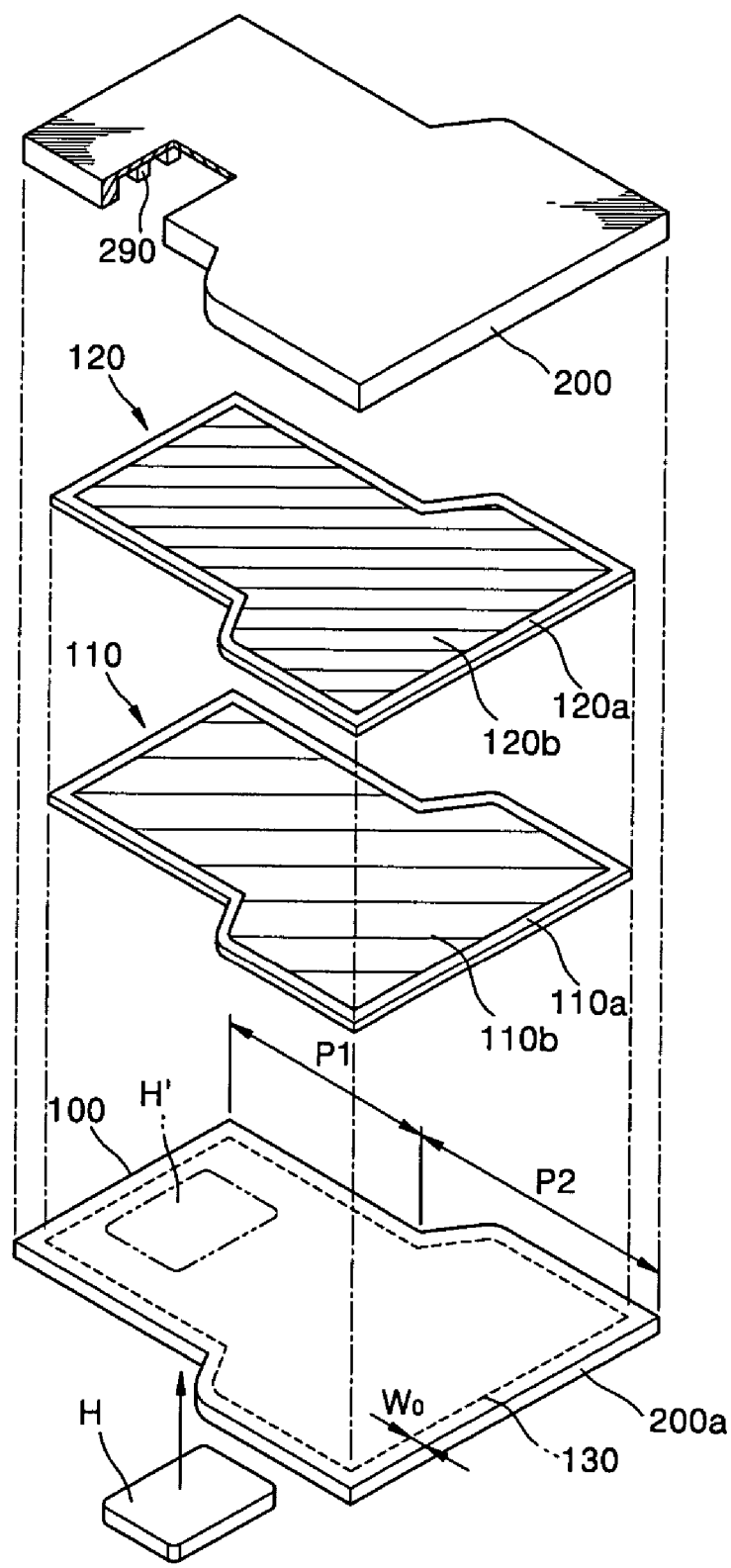
FIG. 5 is a divided perspective view of a substantially flat heat transferring device according to an exemplary embodiment of the present invention.

Referring to FIG. 5, a substantially flat heat transferring device according to an exemplary embodiment of the present invention includes a first lower plate 100, the bottom of which contacts a heat source H (e.g., a high heat-generating chip), a spacer plate 110 and a wick plate 120, which are sequentially stacked on the first lower plate 100, and a first upper plate 200, which covers the two plates 110 and 120.

During the manufacture of the substantially flat heat transferring device, the first upper plate 200 and the first lower plate 100 are bonded to each other along their edges so that they can be hermetically sealed (using, for example, welding, electrostatic bonding, or thermal bonding). The wick plate 120 of a very small thickness includes a plurality of planar wicks and a plurality of holes formed therebetween.

The wick plate 120 may be comprised of at least two different layers. Wick patterns provided on the wick plate 120 may be regular and uniform, although any wick patterns can be provided as long as they can transfer a liquid-phase coolant from a condensing part P2 to a vaporization part P1. In this embodiment, the spacer plate 110 is formed to have the same shape and size as the wick plate 120. The spacer plate 110 may be selectively provided so that the substantially flat heat-transferring device according to the present invention may not include the spacer plate 110.

The wick plate 120 and the spacer plate 110 may be formed to completely fit in the first upper plate 200 so that there is no gap between the inner side of the first upper plate 200 and the circumference of an integrated body of the wick and spacer plates 120 and 110. As a result, the wick plate 120 and the spacer plate 110 can be prevented from moving out of alignment even when the substantially flat heat transferring device shakes due to physical impact. The first upper plate 200 and the first lower plate 100 may be formed to have the same shape when seen from above. In addition, the inner shape and size of the first upper plate 200 at the bottom side may be the same as those of the wick plate 120 and the spacer plate 110.

The thickness of the substantially flat heat transferring device shown in FIG. 5 is about a couple of millimeters (e.g., 1 mm~2 mm). There must be provided a space, through which vapor generated when cooling the heat source (H) can be moved to the condensing part P2, between the wick plate 120 and the first upper plate 200. Since the first lower plate 100 is thicker than the wick plate 120 and the spacer plate 110 in general, the thicknesses of the wick plate 120 and the spacer plate 110 account for only a low percentage of the thickness of the substantially flat heat-transferring device. In other words, the wick plate 120 and the spacer plate 110 are very thin. The spacer plate 110 and the wick plate 120 are positionally maintained to the first lower plate 100 by the surface tension of a liquid-phase coolant (e.g., distilled water, ethanol, methanol, or acetone).

The distance among spacers formed in a spacer forming region 110b of the spacer plate 110 is greater than the distance among planar wicks formed in a planar wick forming region 120b of the wick plate 120. In other words, the density of spacers formed in the spacer forming region 110b is much lower than the density of planar wicks formed in the planar wick forming region 120b.

The spacer forming region 110b is comprised of the spacers and holes formed between them through which the lower plate 100 is exposed. The planar wick forming region 120b is comprised of the planar wicks and holes formed between them, through which the first lower plate 100 is exposed. Accordingly, the fact that the density of the spacers is much lower than the density of planar wicks means that the size of the holes formed between the spacers is greater than the size of the holes formed between the planar wicks. The arranged form of the spacers and the planar wicks in the spacer forming region 110b and the planar wick forming region 120b, respectively, is determined by the way holes are arranged in the spacer forming region 110b and the planar wick forming region 120b, respectively. In other words, if the shape and arrangement of holes in the spacer forming region 110b are determined, the shape and arrangement of spacers are automatically determined. In the same manner, if the shape and arrangement of holes in the planar wick forming region 120b are determined, the shape and arrangement of planar wicks are automatically determined. Accordingly, it is possible to respectively form spacers and planar wicks of various sizes, shapes, and arrangements in the same forming region 110b and the planar wick forming region 120b by varying the size, shape, and arrangement of holes being formed in the spacer forming region 110b and the planar wick forming region 120b, which will be described more fully later.

As described above, while the density of spacers formed in the spacer forming region 110b is much lower than the density of planar wicks formed in the planar wick forming region 120b, the area of holes in the spacer forming region 110b is large enough to include the planar wicks and holes formed in the planar wick forming region 120b. Even though the spacer plate 110 is positioned between the wick plate 120 and the first lower plate 100, most of the bottom surface of the wick plate 120 directly faces the first lower plate 100. Accordingly, sufficient surface tension exists between the wick plate 120 and the first lower plate 100 so as to maintain the adhesion of the wick plate 120 and the first lower plate 100. The spacer plate 110 may be formed to be as thin as possible to generate even greater capillary force.

Even though the coupling of the wick plate 120, the spacer plate 110, and the first lower plate 100 is supposed to be firmly maintained by the surface tension of a liquid-phase coolant, it is possible for the wick plate 120 to be undesirably separated from the first lower plate 100 due to the weakening of surface tension of the liquid-phase coolant by physical impact or other unexpected reason. In other words, the wick plate 120 and the spacer plate 110 may move toward the first upper plate 200. In this case, the circulation of the liquid-phase coolant may be obstructed, preventing the liquid-phase coolant from effectively removing the heat generated from the heat source (H). Accordingly, a dry-out may occur in which the supply of the coolant to the top surface of the first lower plate 100 corresponding to a region H' which contacts the heat source (H) is stopped. If a dry-out occurs in the vaporization part P1, the temperature of the heat source (H) keeps increasing. If this happens, the heat source (H) (e.g., a high heat-generating chip) may operate slowly or not operate at all. In an even worse case, an electronic device in which the high heat-generating chip is installed may completely stop operating.

Accordingly, in order to prevent the wick plate 120 from floating freely between the first lower plate 100 and the first upper plate 200 for whatever reason, various fixing means are provided. Reference numeral 290 in FIG. 5 refers to one example of such fixing means, which is shaped as a protrusion that comes from the inner surface of the first upper plate 200 toward the wick plate 120. The fixing means 290 will be described more fully later.

Referring to FIG. 5, a region 130 on the first lower plate 100, which is marked by a dotted line, refers to a region which contacts the spacer plate 110. An edge 200a of the first lower plate 100, which is outside the region 130, is hermetically bonded to the edge of the first upper plate 200. The edge 200a of the first lower plate 100 may have a width W0 of 1.5–3.0 mm.

The area of the vaporization part P1 which contacts the heat source H of the first lower plate 100 is smaller than the width of the condensing part P2 which does not contact the heat source H and is a region where vapor generated by the vaporization part P1 condenses through phase transformation. Specifically, in this embodiment, the width of the first lower plate 100 is constant in the vaporization part P1, becomes wider from the boundary between the vaporization part P1 and the condensing part P2, and then the width of the first lower plate 100 in the condensing part P2 is maintained at the wider value. A liquid-phase coolant is vaporized in a certain region on the top surface of the first lower plate 100, and this region is right above the region H' at the bottom of the first lower plate 100, which directly contacts the heat source H. Vapor generated in this region moves to the condensing part P2 through a space provided between the first upper plate 200 and the wick plate 120. In the condensing part P2, such vapor transfers the heat generated from the heat source H to the outside and changes into a liquid-phase coolant. Through the process, a liquid-phase coolant is collected in the condensing part P2. As soon as the liquid-phase coolant arrives in the condensing part P2, it permeates the planar wick forming region 120b of the wick plate 120 corresponding to the condensing part P2. The liquid-phase coolant, then, is moved from the condensing part P2 to the vaporization part P1 by capillary force through space between planar wicks formed in the planar wick forming region 120b and the first lower plate 100.

Figure 26:
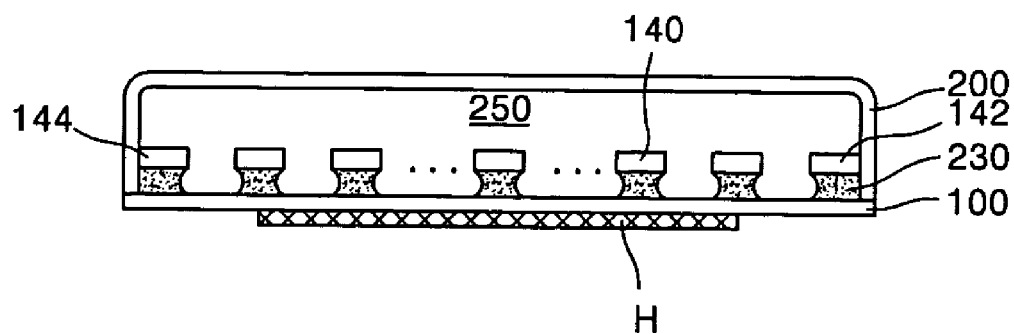
FIGS. 26 through 30 are cross-sectional views of various exemplary embodiments of the substantially flat heat transferring device shown in FIG. 5, taken along a direction perpendicular to a vaporization part, in which a spacer plate is removed between upper and lower plates.

The spacer plate 110 is provided between the wick plate 120 and the first lower plate 100. It should be noted that, even when there is no spacer plate 110, the wick plate 120 and the first lower plate 100 are arranged very close to each other so that a gap between the first lower plate 100 and the wick plate 120, particularly, the planar wicks formed in the planar wick forming region 120b, is small enough to generate capillary force. The liquid-phase coolant collected in the condensing part P2 flows into the vaporization part P1 through gaps among the planar wicks or through the gap between the first lower plate 100 and the planar wicks 140, 142 and 144 as shown in FIG. 26.

Figure 6:
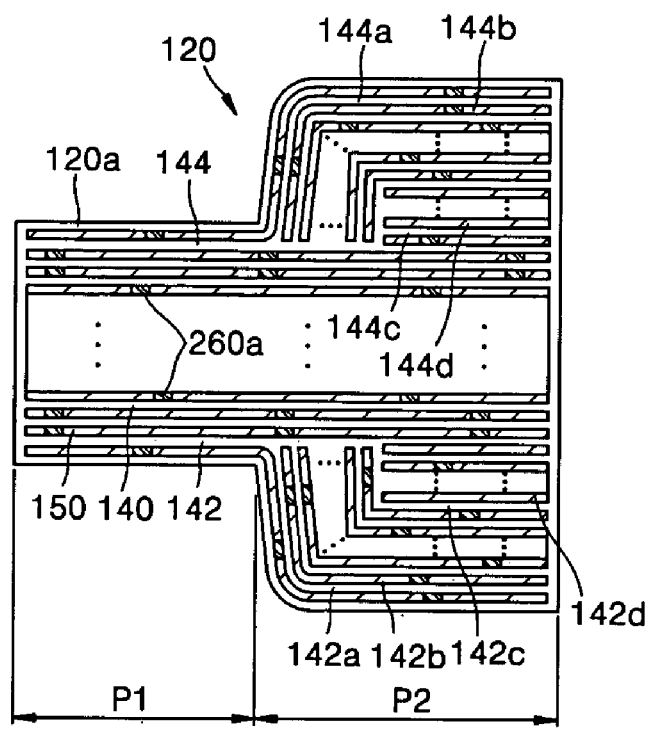
FIGS. 6 through 8 are plan views of first through third exemplary embodiments of the wick plate shown in FIG. 5.
Figure 7:
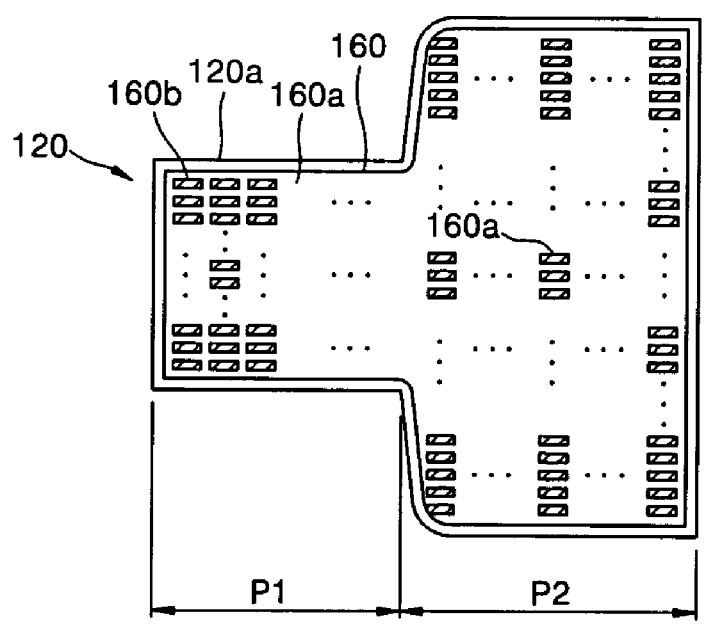
Figure 8:
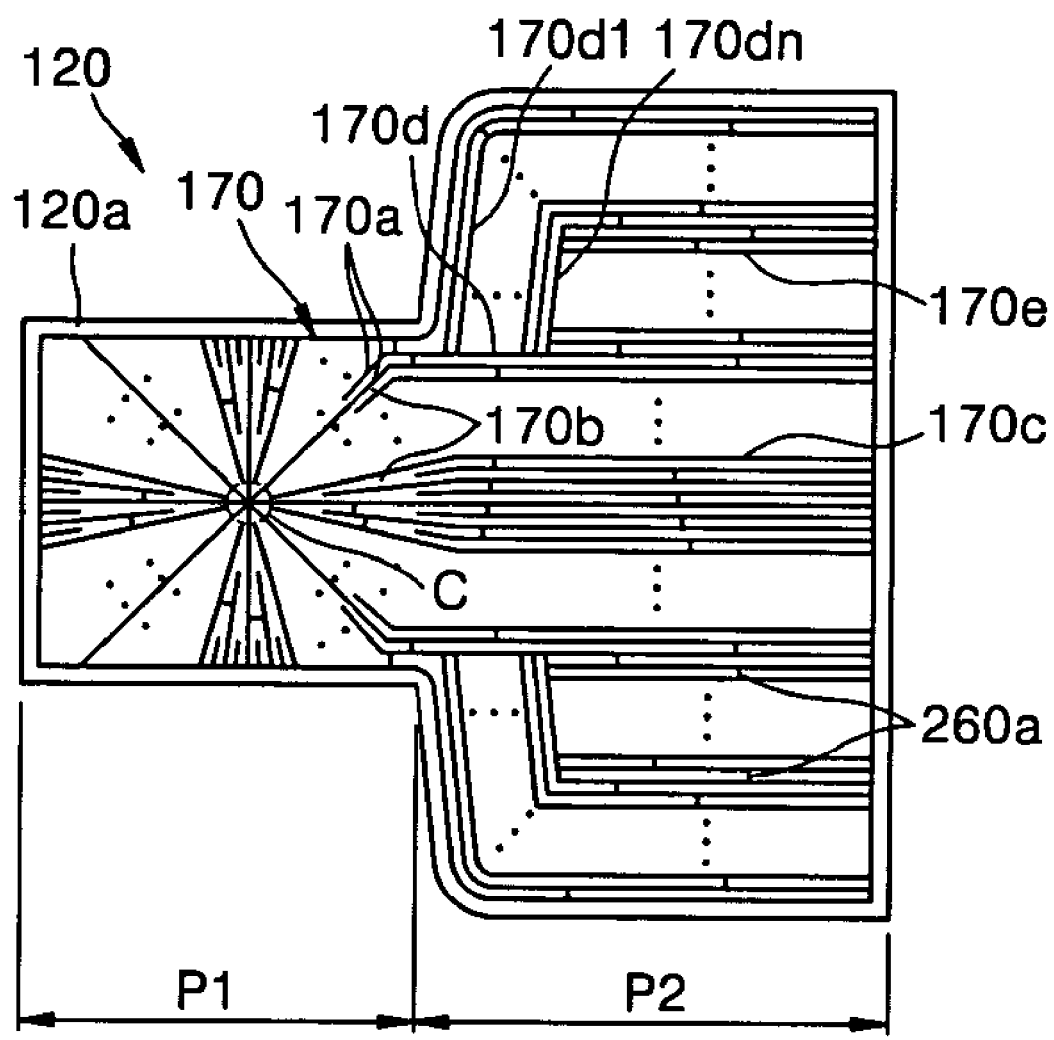

The wick plate 120 is comprised of the edge 120a in contact with the inner circumference of the first upper plate 200 and the planar wick forming region 120b inside the edge 120a. In the planar wick forming region 120b, various planar wicks are formed, as shown in FIGS. 6 through 8.

Such planar wicks form a lot of fine channels, through which a coolant can flow, with the first lower plate 100. The spacer plate 110 is comprised of the edge 110a in contact with the first lower plate 100 as well as the inner circumference of the first upper plate 200 and the spacer forming region 110b inside the edge 110a.

On the other hand, a void must be formed in between the first lower plate 100 and the first upper plate 200. The void is comprised of a vapor moving space 250 and a space in which wick plate 120, or the wick plate 120 and the spacer plate 110 are installed as shown in FIGS. 10 through 20. Accordingly, it is possible to manufacture the first upper plate 200 in consideration of this fact.

The plan shape of the wick plate 120 and the planar wicks formed in the planar wick forming region 120b will be described more fully with reference to FIGS. 6 through 8.

FIG. 6 shows an exemplary embodiment in which planar wicks formed in vaporizing part P1 are a straight line-shape, FIG. 7 shows an exemplary embodiment where the planar wicks are a mesh-shape, and FIG. 8 shows an exemplary embodiment where the planar wicks are radial-shape.

Referring to FIG. 6, first through third planar wicks 140, 142, and 144 are formed in the vaporization part P1 of the wick plate 120. The second planar wick 142 contacts a horizontal portion under the edge 120a surrounding the vaporizing part P1 and is extended to the condensing part P2 along the horizontal portion. The third planar wick 144, which is in symmetry with the second planar wick 142, contacts and extends along an upper horizontal portion of the wick plate edge 120a to the condensing part P2. As shown in FIG. 6, the second and third planar wicks 142 and 144 have a form which the upper and lower portions of the edge 120a are extended in the inside direction of the edge 120a. The width of the wick plate 120 becomes wider in the condensing part P2 beside the vaporization part P1. Accordingly, the second and third planner wicks 142 and 144 branch out in the place condensing part P2 begins.

In particular, the second planar wick 142 is divided into a plurality of planar wicks in the condensing part P2. Among such divided planar wicks, one planar wick which is the mother-body is connected to the edge of the wick plate 120 across the condensing part P2 in a straight line. The rest of the divided planar wicks, i.e., fourth planar wicks 142a and fifth planar wicks 142c, are formed in the extended area of the condensing part P2. The fourth planar wicks 142a are curved in the same shape as a portion surrounding the condensing part P2 of the edge of the wick plate 120. The fourth planar wicks 142a are connected to the right edge of the wick plate 120a surrounding the condensing part P2. The fifth planar wicks 142c are formed between the fourth planar wick 142a and the one planar wick which is the mother-body of the fourth and fifth planar wicks 142a and 142c, and are connected to the right edge of the wick plate 120. The fifth planar wicks 142c are formed in a straight line shape parallel to the second planar wick 142.

The third planar wick 144 is divided into a plurality of sixth and seventh planar wicks 144a and 144c at the place in the condensing part P2 begins in the same way as the second planar wick 142. The sixth and seventh planar wicks 144a and 144c are formed in the extended area of the condensing part. One planar wick, which is the mother-body, of a plurality of planar wicks divided from the third planar wick 144, like that of the second planar wick 142, is connected to the edge of the wick plate 120 across the condensing part P2 in a straight line. The sixth and seventh planar wicks 144a and 144c are in symmetry with the fourth and fifth planar wicks 142a and 142c, and thus their detailed description will be omitted.

A second hole 142b having a predetermined width is formed between the fourth planar wicks 142a, and a third hole 142d having a predetermined width is formed between the fifth planar wicks 142c. A fourth hole 144b and a fifth hole 144d are formed between the sixth planar wicks 144a and between the seventh planar wicks 144c, respectively. Like this, the wick plate 120 is comprised of a plurality of planar wicks and a plurality of holes formed between the planar wicks.

The liquid-phase coolant gathering in the condensing part P2 flows into a space where a capillary force acts between the first lower plate 100 and the fourth through seventh planar wicks 142a, 142c, 144a, and 144c through the second through fifth holes 142b, 142d, 144b, and 144d and then moves to the vaporization part P1 according to the second planar wick 142. The liquid-phase coolant may also move to the vaporization part P1 via the second through fifth holes 142b, 142d, 144b, and 144d.

As shown in FIG. 6, at least some planar wick selected of the second through seventh planar wicks 142, 144, 142a, 142c, 144a, and 144c may be connected by a planar wick bridge 260a in order to adhere the wick plate 120 to the first lower plate 100 more stably, in which case the planar wick bridge 260a connects two adjacent planar wicks. Since the planar wick bridge 260a connects sides of adjacent planar wicks, there may be as much capillary force between the planar wick bridge 260a and the first lower plate 100 as that acting between the first lower plate 100 and the fourth through seventh planar wicks 142a, 142c, 144a, and 144c. Accordingly, even if the liquid-phase coolant encounters the planar wick bridge 260 on its way to the vaporization part P1 through the second through fifth holes 142b, 142d, 144b, and 144d, its stream can continue through a space between the planar wick bridge 260a and the first lower plate 100.

A plurality of first planar wicks 140 are formed in the remaining area of the planar wick forming region 120b which the second through seventh planar wicks 142, 144, 142a, 142c, 144a, and 144c are not formed. A first hole 150 is formed between the first planar wicks 140. In other words, the first planar wicks 140 are formed in the remaining area except the extended area of the condensing part P2 in the planar wick forming region 120b. The first planar wicks 140 which begin from the vertical portion of the surrounding the vaporizing part P1 of the edge 120a are formed in parallel with the second and third planar wicks 142 and 144 and are connected to the edge 120a across the condensing part P2 in a straight line. The first hole 150 having a predetermined width is formed between the first planar wicks 140 and each of the second and third planar wicks 142 and 144. The first hole 150 is also formed between the first planar wicks 140. The first hole 150 is extended along with the first planar wick 140 to the edge 120a of the wick plate 120 across the vaporization part P1 and the condensing part P2. Accordingly, as in the case of the second through fifth holes 142b, 142d, 144b, and 144d formed in the extended area of the condensing part P2, the liquid-phase coolant can flow between the first planar wick 140 and the first lower plate 100 through the first hole 150 by capillary force. The first hole 150, unlike the second through fifth holes 142b, 142d, 144b, and 144d, extends straight from the condensing part P2 to the vaporization part P1. Also, since the width of the first hole 150 is a very narrow so that capillary action can occur. Accordingly, the liquid-phase coolant can move to the vaporization part P1 through the first hole 150 itself as well as through the space between the first planar wick 140 and the first lower plate 100. Vapor generated in the vaporization part P1 is emitted to the vapor pathway 250 through the first hole 150, and thus a region where the vapor is practically vaporized in the vaporizing part P2 is determined by the first hole 150.

As shown in FIG. 7, an eighth planar wick 160a which is different from the above described planar wicks may be provided in a planar wick forming region 160 of the wick plate 120 may include. A plurality of sixth holes 160b and a plurality of seventh holes 160c are formed in the eighth planar wick 160a. The sixth holes 160b are formed in the vaporization part P1, and are a vaporizing region through which vapor is emitted. On the other hand, the seventh holes 160c formed in the condensing part P2 are an inlet through which the liquid-phase coolant flow into the condensing part P2. The sixth and seventh holes 160b and 160c may be formed to have the same size. However, they may also be formed to have different sizes. The sixth and seventh holes 160b and 160c are arranged apart from one another by a predetermined distance. Accordingly, the eight planar wick 160a looks like a mesh.

As shown in FIG. 8, a planar wick different from the above described planar wicks may be formed in a planar wick forming region 170 of the wick plate 120. In FIG. 8, unlike in FIGS. 6 and 7, planar wicks are represented by lines for the convenience of drawing.

Referring to FIG. 8, the planar wicks formed in the planar wick forming region 170 may be different in shape depending on the region where they belong, i.e., either the vaporization part P1 or the condensing part P2.

In particular, ninth planar wicks 170a are formed in the vaporization part P1 in a radial shape extending from a center region (C) of the vaporization part P1. Tenth and eleventh planar wicks 170c and 170d are formed in the condensing part P2. The ninth planar wicks 170a are comprised of various kinds of radial-shaped planar wicks. In other words, the ninth planar wicks 170a are divided into four radial-shaped planar wicks: a first radial-shaped planar wick is formed so as to meet in the center of a center region C. A second radial-shaped planar wick is formed between the first radial-shaped planar wicks extending from the boundary of the center region (C). A third radial-shaped planar wick is formed between the first and second radial-shaped planar wicks extending from a predetermined point distant away from the boundary of the center region (C). A fourth radial-shaped planar wick is formed between the first and third radial-shaped planar wicks or between the second and third radial-shaped planar wicks extending from a certain point further distant away from a predetermined point from which the third radial-shaped planar wicks begin. An eight hole 170b is formed among the first through fourth radial-shaped planar wicks. Vapor is emitted through the eight hole 170b. The eighth hole 170b extends to the condensing part P2.

The tenth and eleventh planar wicks 170c and 170d extend from the ninth planar wicks 170a and are changed into a straight line shape at the portion where the condensing part P2 begins. The eleventh planar wick 170d is divided into a plurality of twelfth planar wicks 170d1, 170d2, ... , 170dn and a plurality of thirteenth planar wicks 170e at the portion the condensing part P2 begins. The tenth planar wick 170c formed in the condensing part P2 is the same as the first planar wick 140 formed in the condensing part P2, and the eleventh through thirteenth planar wicks 170d, 170d1, ... , 170dn, and 170e are practically the same as the second or third planar wicks 142 and 144 formed in the condensing part P2.

Some of the first through fourth radial-shaped planar wicks or some of the above described planar wicks formed in a straight line shape in the condensing part P2 are connected by the planar wick bridge 260a.

As shown in FIGS. 6 through 8, various kinds of planar wicks may be formed in the planar wick forming region 120b of the wick plate 120. In addition to the embodiments shown in FIGS. 6 through 8, planar wicks having other shapes may be formed in the planar wick forming region 120b. For example, a plurality of holes may be formed in the planar wick forming region 120b so that the liquid-phase coolant can flow from the condensing part P2 to the vaporization part P1, i.e., so that the liquid-phase coolant gathered in the condensing part P2 smoothly flows into the vaporization part P1 through a space between planar wicks and/or through a space between the first lower plate 100 and the planar wicks. In this case, the plurality of holes may be arranged in a mesh shape in all regions of the vaporization part P1 and the condensing part P2 or in an arbitrary shape depending on the characteristics of the region where the holes are located. Also, the size of the holes may be varied.

Figure 9A:
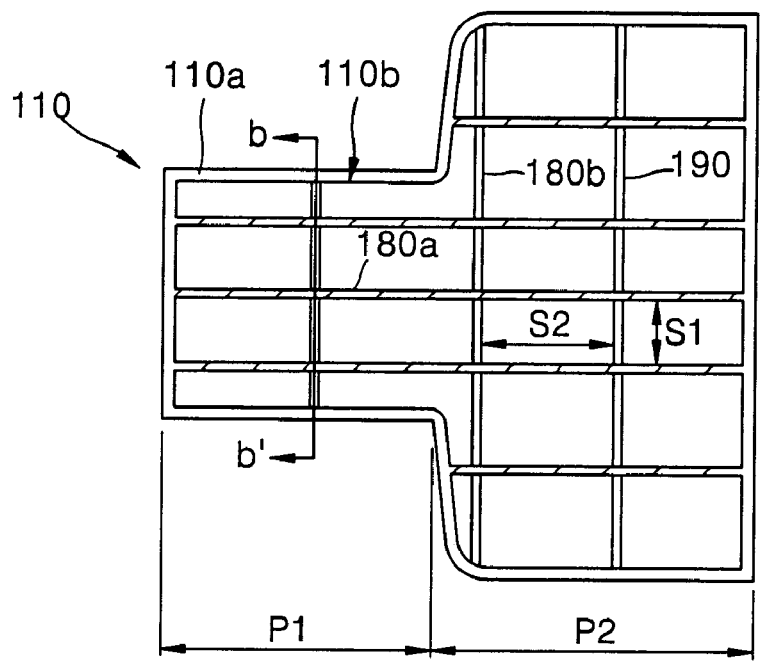
FIG. 9A is a plan view of a spacer plate shown in FIG. 5.

Referring to FIG. 9A, a plurality of first spacers 180a and a plurality of second spacers 180b are horizontally arranged in a spacer forming region 110b. The first spacers 180a are formed across the vaporization part P1 and the condensing part P2. The second spacers 180b are arranged in parallel with the first spacers 180a in the extended area of the condensing part P2. Spacer plate bridges 190 are provided to connect some of the first and second spacers 180a and 180b. The spacer plate bridges 190 are an example of means for stabilizing the posture of the spacer plate 110. The spacer plate bridges 190 are provided between the first and second spacers 180a and 180b as well as between the first spacers 180a. The spacer plate bridges 190 may be arranged in rows, which are in parallel to one another, or they may be arranged in a zigzag pattern.

The first spacers 180a are horizontally formed across the vaporization part P1 and the condensing part P2 and are isolated from one another by a first distance S1. The first distance S1 is broader than the gap between the planar wicks formed in the planar wick forming region 120b. Some of the second spacers 180b are formed in the direction across the vaporization part P1, and the others are formed in the direction across the condensing part P2. The second spacers 180b are formed in parallel to one another and are isolated by a second distance S2. The second distance S2 is broader than the first distance S1. While the first and second distances S1 and S2 are much broader than the gap between the planar wicks, the width of each of the first spacers 180a is almost the same as the width of each of the planar wicks.

The spacer plate 110 may be formed in different shapes. For example, the shape and/or size of the spacer plate 110 may be different from the shape and/or size of the wick plate 120, and particularly, the spacer plate 110 may be replaced with some spacers or individual materials formed on parallel with the planar wicks formed in the wick plate 120. The spacers may be formed separately from the spacer plate 110 or may be permanently fixed on the first lower plate 100.

Figure 9B:
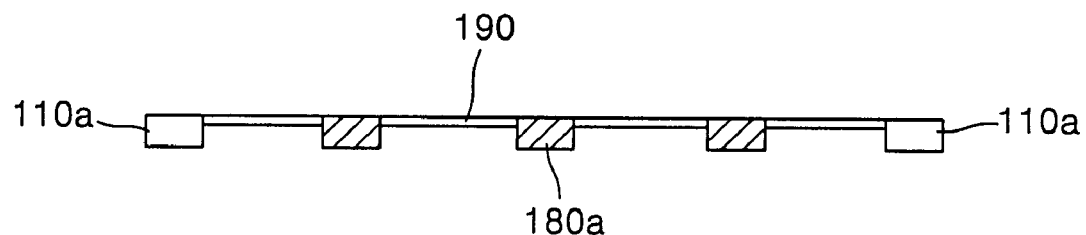
FIG. 9B is a cross-sectional view of a spacer plate, taken along line b–b' of FIG. 9A.

Referring to FIG. 9B, the spacer plate bridges 190 are provided between two adjacent first spacers 180a and between the edge 110a and a first spacer 180a so that they can connect the two adjacent first spacers 180a and can connect the first spacer 180a to the edge 110a at an upper part of either side of each of the first spacers 180*a*. This fact also applies to the spacer plate bridges 190 formed in the condensing part P2.

Next, various exemplary embodiments of a substantially flat heat transferring device, in which the wick plate 120 and the spacer plate 110 are sequentially stacked on the first lower plate 100, will be described with reference to FIGS. 10 through 25. Various exemplary embodiments of a substantially flat heat transferring device without the spacer plate 110 will be described with reference to FIGS. 26 through 30. The exemplary wick plate 120 shown in FIG. 6 and the exemplary spacer plates 110 shown in FIG. 9B are used in the former. In the latter, the exemplary wick plate 120 shown in FIG. 6 is used.

Figure 10:
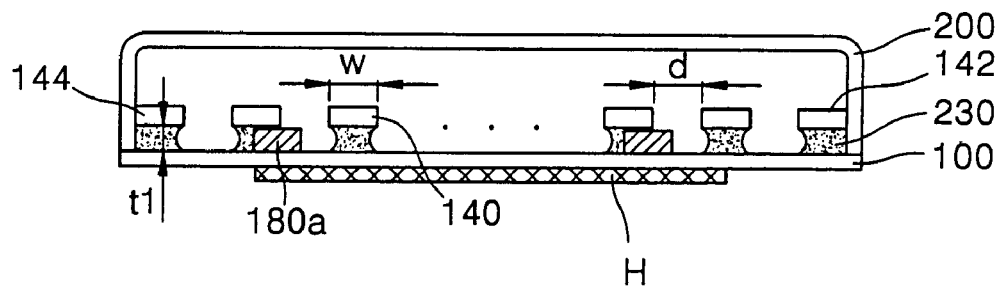

Referring to FIG. 10, while the first spacers 180*a* of the spacer plate 110 are sparsely formed on the first lower plate 100, the first through third planar wicks 140, 142, and 144 are much more densely formed on the first lower plate 100. As shown in FIG. 10, the density of planar wicks formed in the planar wick forming region 120*b* is much higher than the density of spacers formed in the spacer forming region 110*b*. Such density distribution is maintained in the condensing part P2. Accordingly, a liquid-phase coolant flows from the condensing part P2 to the vaporization part P1 through the first through third planar wicks 140, 142, and 144. The transfer of the liquid-phase coolant from the condensing part P2 to the vaporizing part P1 is caused by capillary action. Accordingly, a gap between the first lower plate 100 and the first through third planar wicks 140, 142, and 144 is maintained so that capillary action for the liquid-phase coolant can be caused.

The first spacers 180*a* support the first through third planar wicks 140, 142, and 144, and thus the gap between the first lower plate and the first through the third planar wicks 140, and 142, and 144 is determined by the thickness of the first spacers 180*a*. Accordingly, the thickness t1 of the first spacers 180*a* is small enough to cause capillary action for the liquid-phase coolant that flows between the first through third planar wicks 140, 142 and 144 and the first lower plate 100 from the condensing part P2. For example, the thickness t1 of the first spacers 180*a* may be 50 µm. Reference numeral 230 refers to the liquid-phase coolant flowing from the condensing part P2 to the vaporization part P1 through the gap between the first lower plate 100 and the first through third planar wicks 140, 142, and 144 by capillary action. Reference letter d refers to the distance between the first and second planar wicks 140 and 142, the distance between the first and third planar wicks 140 and 144, or the distance between the first planar wicks 140. The region in the vaporization part P1 where coolant is vaporized is determined by the distance d, and the distance d is a predetermined value, which can lower vaporization heat resistance, for example, 100 µm. Reference letter W refers to the width of the first through third planar wicks 140, 142, and 144. The width W of the first through third planar wicks 140, 142, and 144 is determined in consideration of the coolant vaporizing region in the vaporization part P1 and the vaporization heat resistance. For example, the width W of the first through third planar wicks 140, 142, and 144 may be 100 µm.

In FIG. 10, the thickness of the first through third planar wicks 140, 142, and 144 is thicker than that of the first spacers 180*a*. For example, the thickness of the first through third planar wicks 140, 142, and 144 may be 100 µm. The distance between the top surface of the first lower plate 100 and the inner surface of the second upper plate 200 may be determined in consideration of the thickness of the first spacers 180*a*, the thickness of the first through third planar wicks 140, 142, and 144 and a vapor moving space provided between the wick plate 120 and the first upper plate 200. For example, the distance between the top surface of the first lower plate 100 and the inner surface of the first upper plate 200 may be 0.8 mm. Considering that the thickness of the first lower plate 100 and the first upper plate 200 is about 0.5 mm, the entire thickness of the substantially flat heat transferring device shown in FIG. 10 is about 1.8 mm. The entire thickness of the device may be different depending on the material constituting the first lower plate 100 and/or the first upper plate 200 or depending on the material constituting the wick plate 120 and the spacer plate 110. The first and second planar wicks 140 142 and the first spacers 180*a* are three-dimensionally shown in FIG. 11A.

Figure 11A:
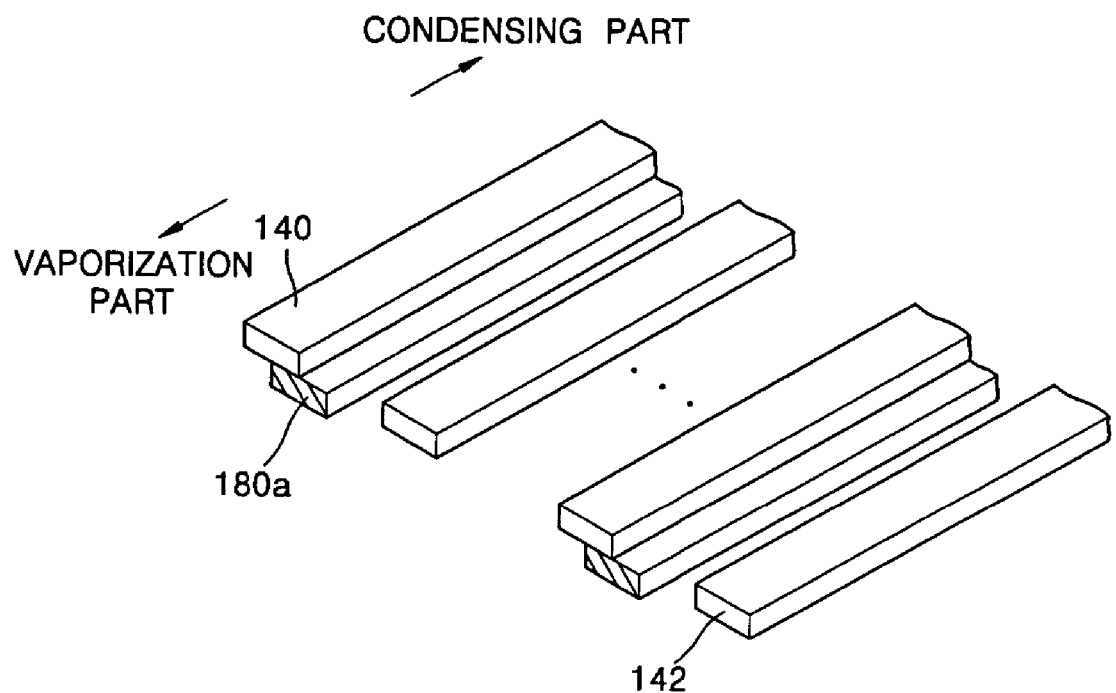
Figure 11B:
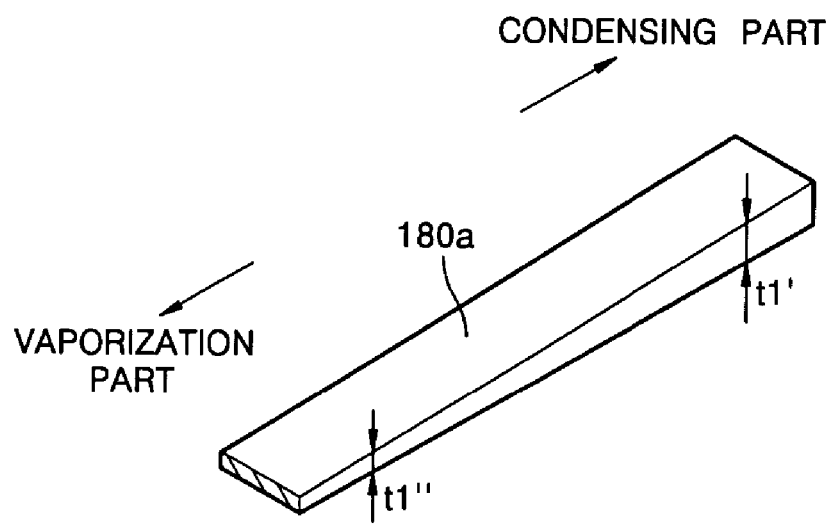
FIGS. 11B and 11C are diagrams of various exemplary embodiments of spacers.

As shown in FIG. 11B, Portions of a first spacer 180*a* may have different thicknesses. In this case, since a liquid-phase coolant needs to be quickly provided from the condensing part P2 to the vaporization part P1, the first spacer 180*a* may be formed to have a decreasing thickness so that the thickness of the first spacer 180*a* is larger at the condensing part P2 than at the vaporization part P1. The thickness t1' of the first spacer 180*a* at the condensing part P2 is equal to or smaller than a maximum thickness that can enable first through third capillary patterns 140, 142, and 144 to exert capillary forces on a liquid-phase coolant in the condensing part P2. The thickness t1" of the first spacer 180*a* in the vaporization part P1 is smaller than the thickness of the first spacer 180*a* in the condensing part P2.

Figure 11C:
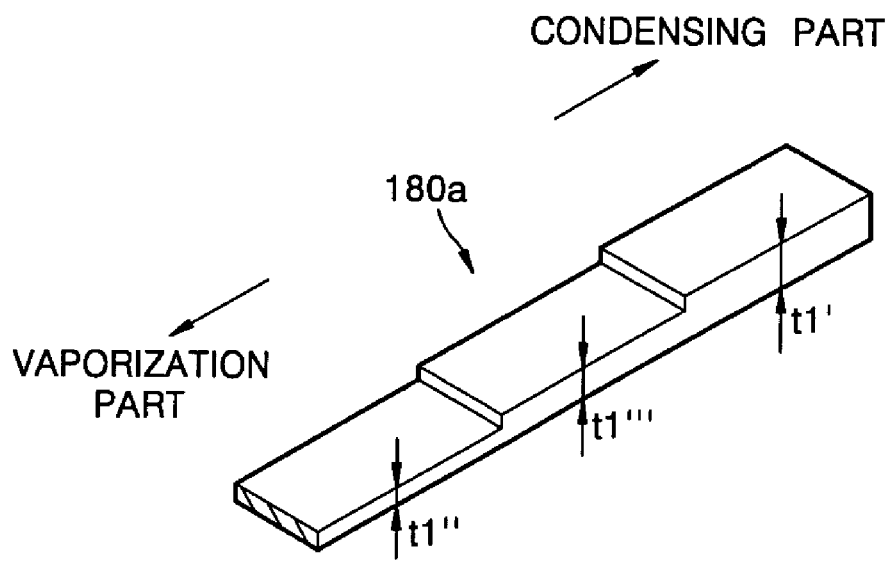

Alternatively, the first spacer 180*a* could have an irregularly varying thickness t1, as shown in FIG. 11C. In other words, the spacer 180*a* has a thickness t1' in the condensing part P2, a thickness t1" in the vaporization part P1, and a thickness t1'" in some place between the condensing part P2 and the vaporization part P1. Here, the thickness t1'" is smaller than the thickness t1' but larger than the thickness t1".

If the spacer 180 is formed in a staircase shape, as shown in FIG. 11C, the plate wick 120, mounted on the first spacer 180*a*, may be formed in a staircase shape as well.

When, as described above, the first spacer 180*a* is formed having a larger thickness in the condensing part P2 than in the vaporization part P1, capillary forces become stronger in the vaporization part P1 than in the condensing part P2 so that a liquid-phase coolant can be more quickly transferred from the condensing part P2 to the vaporization part P1.

Figure 12:
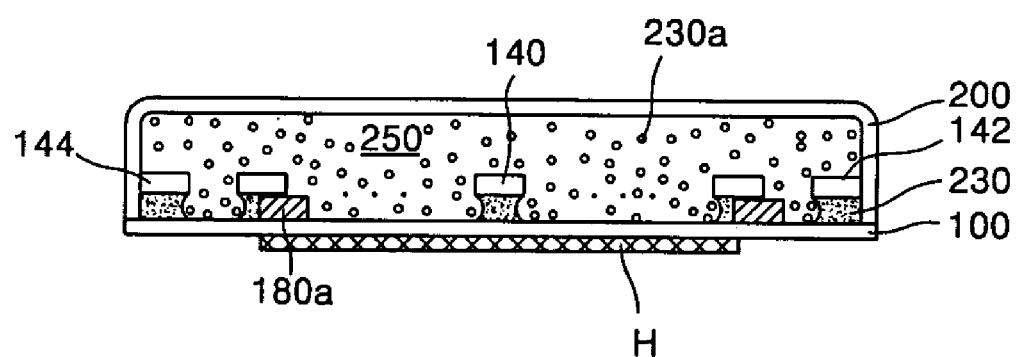

FIG. 12 shows vaporization of the liquid-phase coolant, to which heat transferred from the heat source H is absorbed, through holes between the first through third planar wicks 140, 142, and 144. In FIG. 12, reference numeral 230*a* refers to vapor. The vapor 230*a* generated in the vaporization part P1 transfers to the condensing part P2 through the vapor moving space 250 provided between the first upper plate 200 and the first through third planar wicks 140, 142, and 144.

Figure 13A:
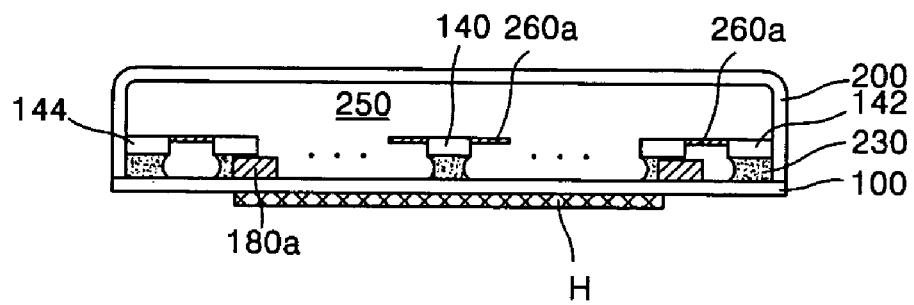
FIGS. 13A through 13D are diagrams of exemplary embodiments of a bridge provided to planar wicks.
Figure 13B:
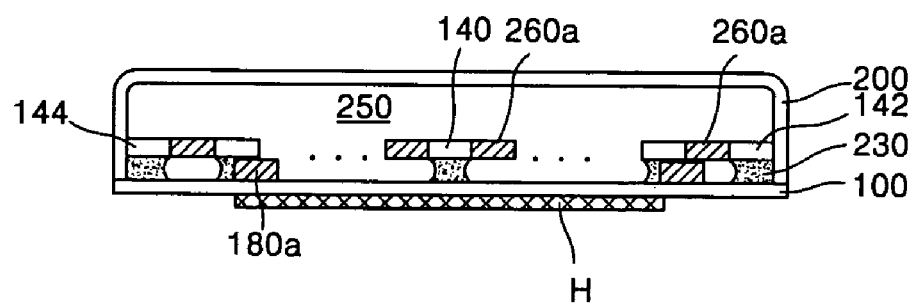

FIGS. 13A through 13D show a means for preventing the first through third planar wicks 140, 142, and 144 from moving in a direction parallel to the first lower plate 100 due to external impact or other reasons. In these drawings, at least some of the first through third planar wicks are connected to one another by the planar wick bridge 260*a*. The thickness of the planar wick bridge 260*a* may be thinner than the thickness of the first through third planar wicks 140, 142, and 144, or, as shown in FIG. 13B, the thickness of the planar wick bridge 260*a* may be the same as that of the first through third planar wicks 140, 142, and 144.

Figure 13C:
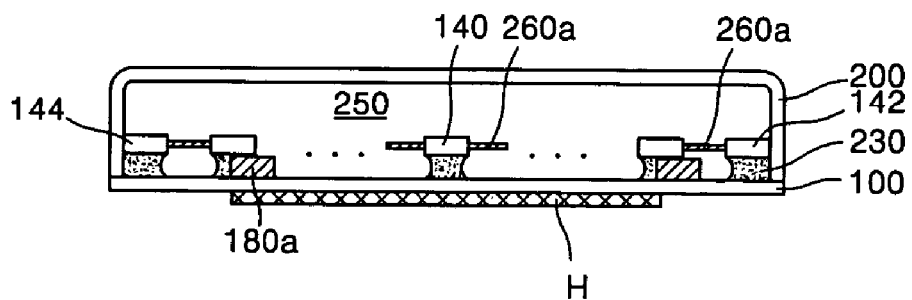
Figure 13D:
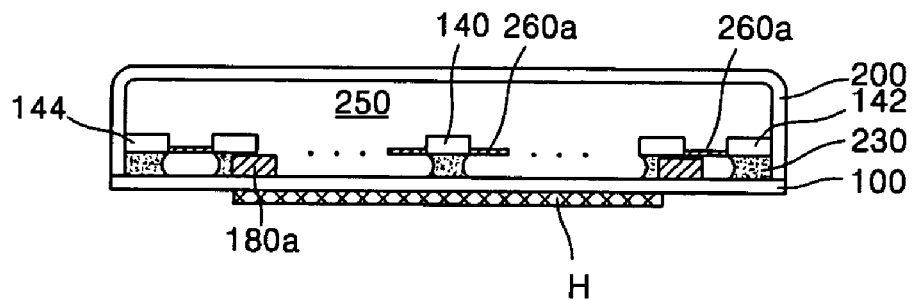

In a case where the planar wick bridge 260*a* is thinner than the first through third planar wicks 140, 142, and 144, it may be connected to an upper part of either side of the first through third planar wicks 140, 142, and 144, as shown in FIG. 13A. Alternatively, the planar wick bridge 260a may be provided to connect a middle part of either side of the first through third planar wicks 140, 142, and 144, as shown in FIG. 13C. The planar wick bridge 260a may also be provided to connect a lower part of either side of the first through third planar wicks 140, 142, and 144, as shown in FIG. 13D. In any one of the above-described cases, the same capillary force as the capillary force existing between the first lower plate 100 and the first through third planar wicks 140, 142, and 144 exists between the planar wick bridge 260a and the first lower plate 100. Accordingly, when the liquid-phase coolant encounters the planar wick bridge 260a on its way to the vaporization part P1 from the condensing part P2, it can continue to move in the same direction through the gap between the first lower plate 100 and the planar wick bridge 260a. In addition, since the number of planar wick bridges 260a is much smaller than the number of planar wicks, the planar wick bridges 260a do not significantly affect the movement of the liquid-phase coolant.

Figure 14:
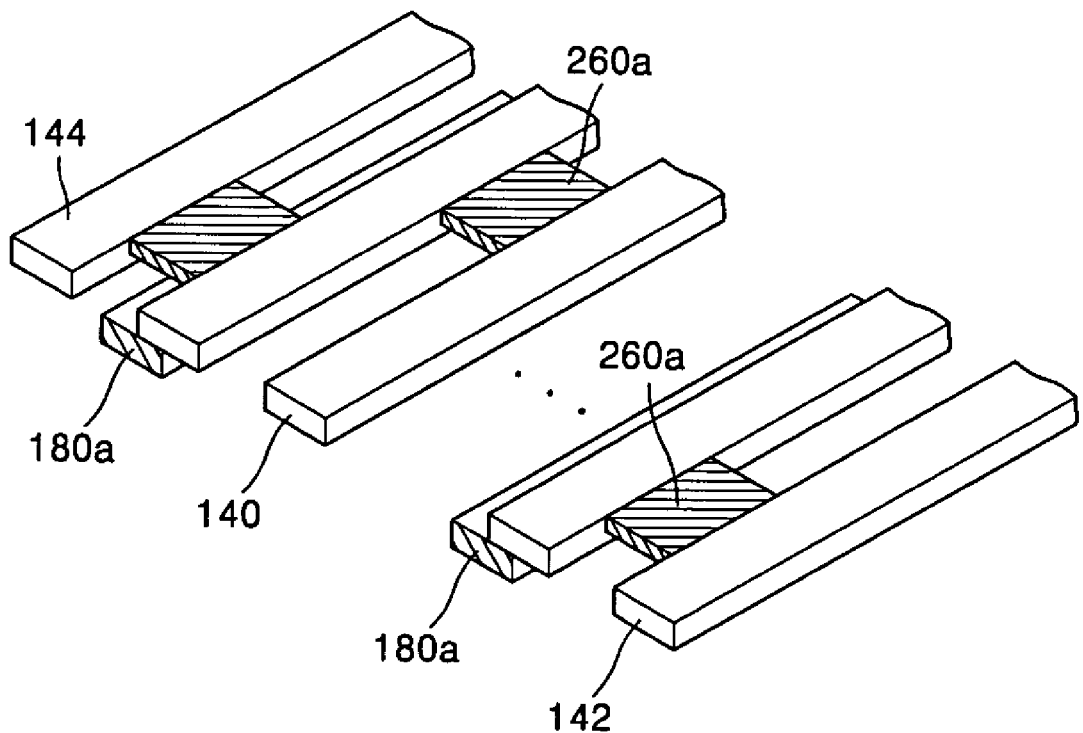

FIG. 14 shows three-dimension structure of the first through third planar wicks 140, 142, and 144 connected by the planar wick bridges 260a. Referring to FIG. 14, each of the planar wick bridges 260a connects portions of two adjacent planar wicks. In order to increase the stability of the position of the wick plate 120, the wick plate bridges 260a may be arranged in a zigzag pattern instead of in rows. The number of planar wick bridges 260a in the vaporization part PI may be limited in consideration of the vaporizing region and the vaporization heat resistance.

Figure 15:
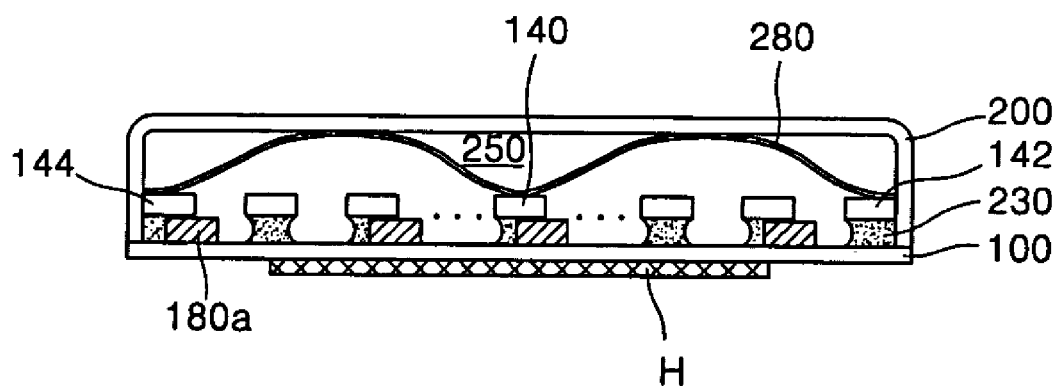

FIG. 15 shows a substantially flat heat transferring device including a means for preventing the first through third planar wicks 140, 142, and 144 from moving in a direction perpendicular to the first lower plate 100. The substantially flat heat transferring device shown in FIG. 15 includes an elastic element 280 (e.g., a plate spring) between the first upper plate 200 and the first through third planar wicks 140, 142, and 144. The elastic element 280 can absorb impact externally given to the substantially flat heat transferring device, so that the first through third planar wicks 140, 142, and 144 can be prevented from moving in a direction perpendicular to the first lower plate 100. The elastic element 280 and the first through third planar wicks 140, 142, and 144 are three-dimensionally shown in FIG. 16.

Figure 16:
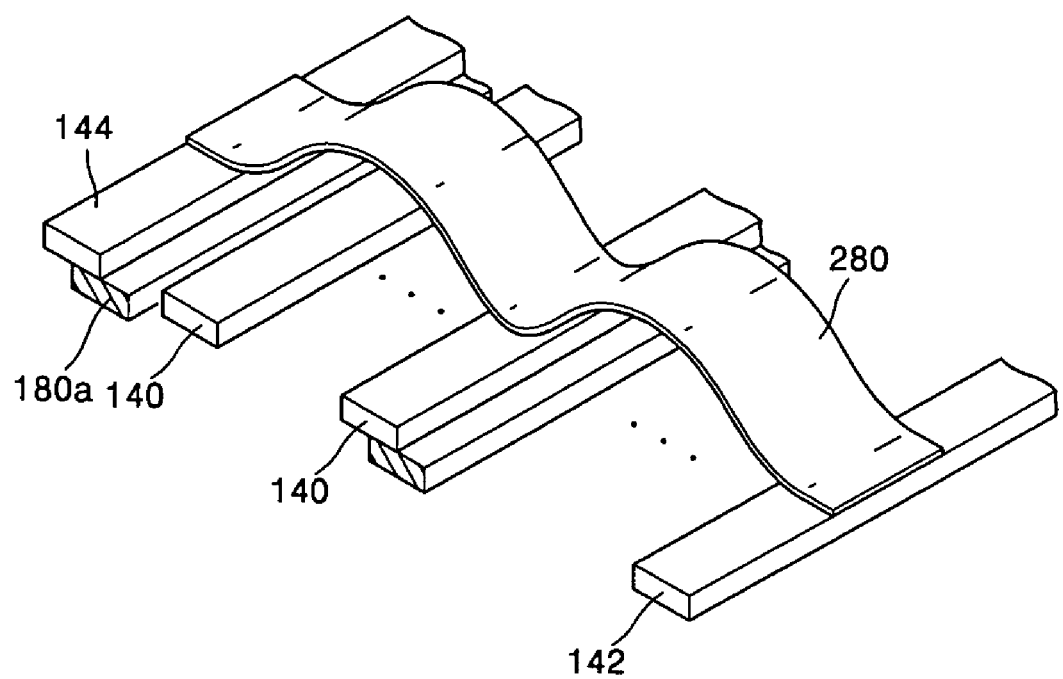

Referring to FIG. 16, the elastic element 280 has a smaller width than the length of the first through third planar wicks 140, 142, and 144. Also, the elastic element 280 does not account for a lot of space in the vapor moving space 250 between the first upper plate 200 and the first through third planar wicks 140, 142, and 144. Accordingly, it is possible to ignore the influence of the elastic element 280 on the movement of vapor from the vaporization part P1 to the condensing part P2.

Figure 17:
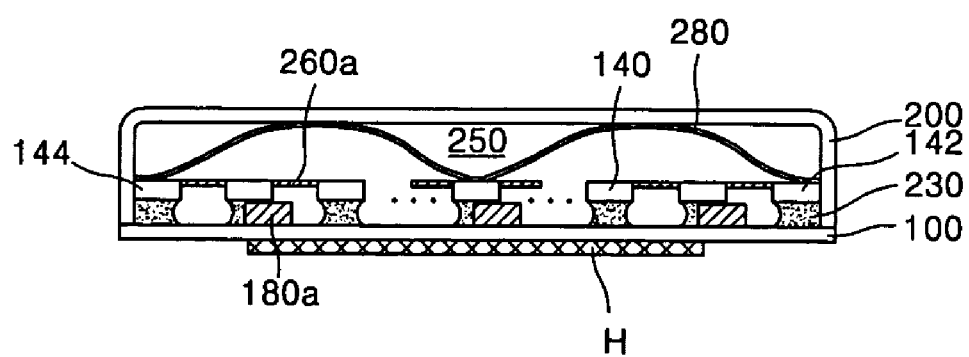

FIG. 17 shows a substantially flat heat transferring device including a an elastic element 280 and planar wick bridges 260a, for preventing the first through third planar wicks 140, 142, and 144 from moving in a direction perpendicular to the first lower plate 100.

Figure 18A:
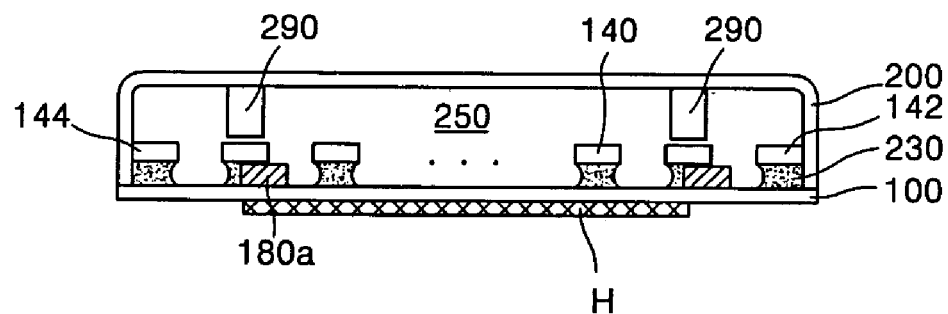
Figure 18B:
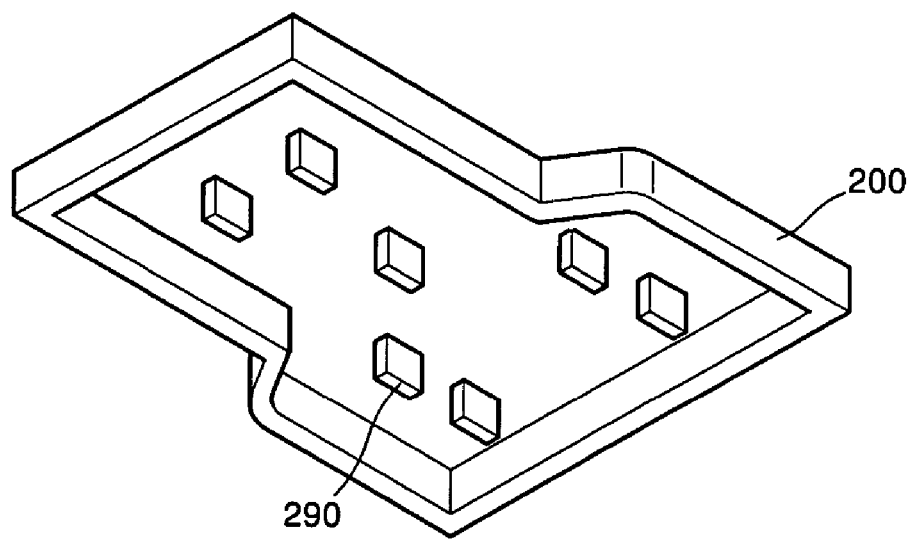
FIGS. 18B through 18D are diagrams of exemplary embodiments of a first protrusion provided at an upper plate.
Figure 18C:
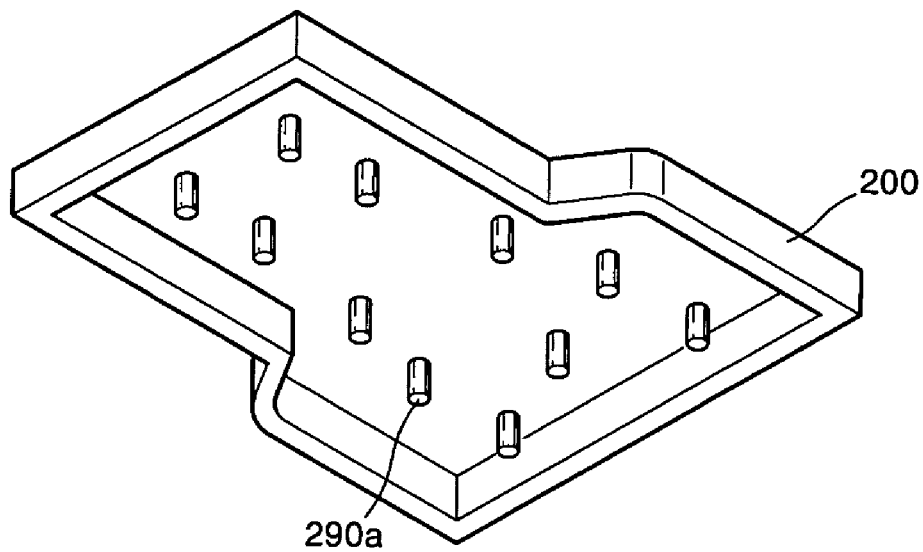
Figure 18D:
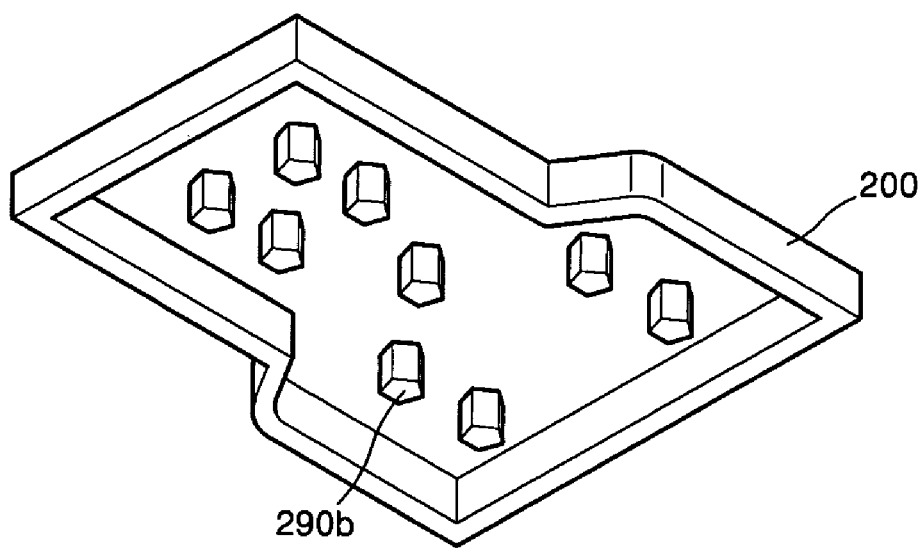

FIG. 18A shows a substantially flat heat transferring device including first protrusions 290 protruding toward the first through third planar wicks 140, 142, and 144 as the means for preventing the first through third planar wicks 140, 142, and 144 from moving in a direction perpendicular to the first lower plate 100. The first protrusions 290 are sparsely formed to have a low density like the first spacer 180a, which is shown in FIG. 18B. The first protrusions 290, as shown in FIG. 18A, may be formed having a rectangular cross section and extending along the direction of the length of the first upper plate 200. However, the first protrusions 290 could be formed having a circular cross section or a polygonal cross section, as shown in FIG. 18C and 18D, respectively.

Figure 19:
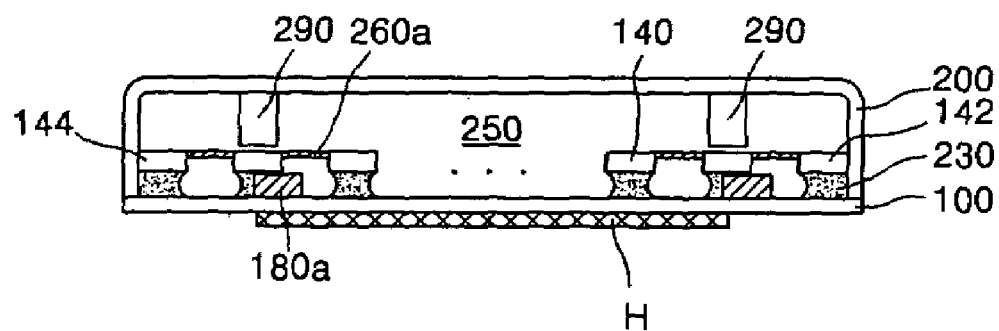

The first protrusions 290 protrude to be very close to the surfaces of the first through third planar wicks 140, 142, and 144 so that they almost contact the first through third planar wicks 140, 142, and 144. In the state like this, as shown in FIG. 19, the planar bridges 260a can be further provided between the first through third planar wicks 140, 142, and 144.

Figure 20:
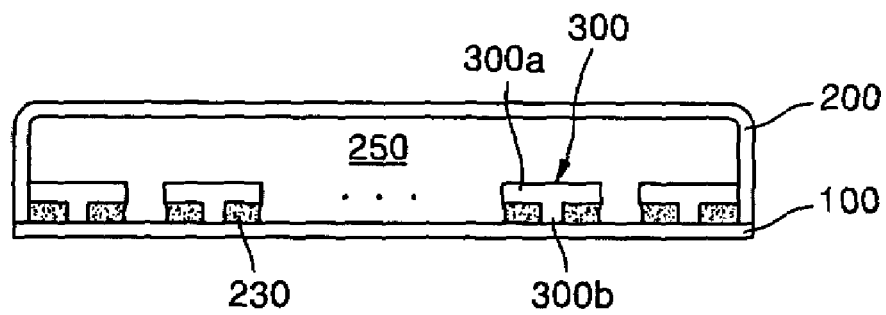
Figure 21:
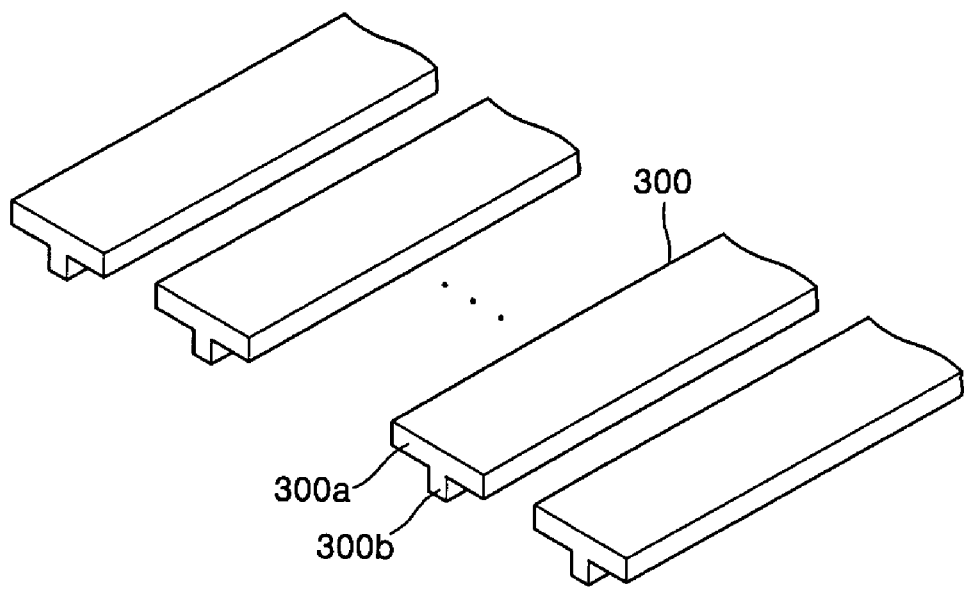

FIG. 20 shows a substantially flat heat transferring device including fourteenth planar wicks 300 on the first lower plate 100 which is one body consisting of the wick plate 120 and the spacer plate. Each of the fourteenth planar wicks 300 includes a supporter 300b, which has the same thickness and functions as the first spacers 180a, and wings 300a, which, like the first through third planar wicks 140, 142, and 144, make the liquid-phase coolant 230 flow from the condensing part P2 to the vaporization part P1. Every fourteenth planar wick 300 may have the supporter 300b, or, in an alternative embodiment, only some of the fourteenth planar wicks 300 may have the supporter 300b. The fourteenth planar wicks 300 are three-dimensionally shown in FIG. 21.

All of the planar wicks and/or holes, which have been described above as being formed in the planar wick forming region 120b of the wick plate 120, together with the fourteenth planar wicks 300 are formed using wet or dry etching or punching. Accordingly, it is easy to manufacture the planar wicks and the holes described in the embodiments of the present invention. In addition, the costs of manufacturing the planar wicks and the holes can be reduced. Moreover, it is possible to form planar wicks, spacers, and planar wick bridges according to the characteristics of the vaporization part P1 and the condensing part P2.

Figure 22:
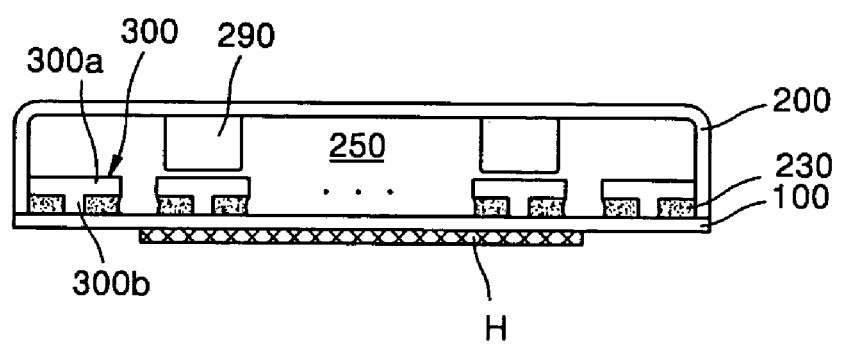

FIG. 22 shows a case in which the first protrusions 290 are provided at an inner surface of the first upper plate 200 as the means for preventing the fourteenth planar wicks 300 from moving in a direction perpendicular to the first lower plate 100 in the exemplary embodiment shown in FIG. 20.

Figure 23:
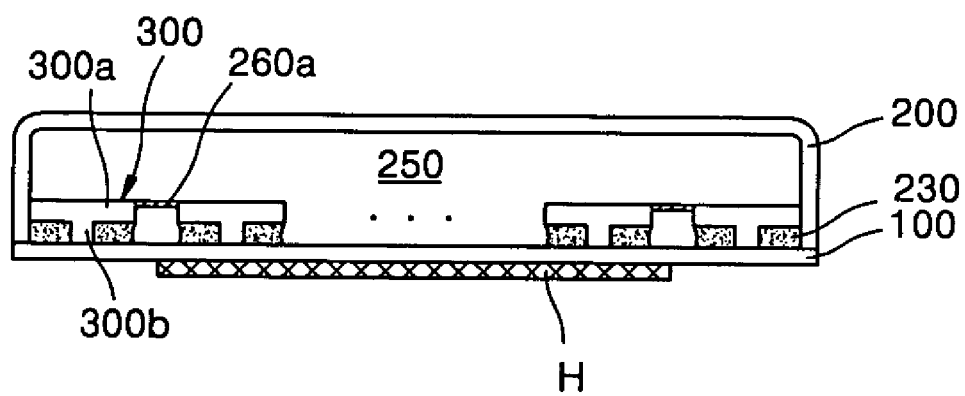

FIG. 23 shows a case in which the planar wick bridge 260a is formed between the fourteenth planar wicks 300 as the means for preventing the fourteenth planar wicks 300 from moving in a direction parallel to the first lower plate 100.

Figure 24:
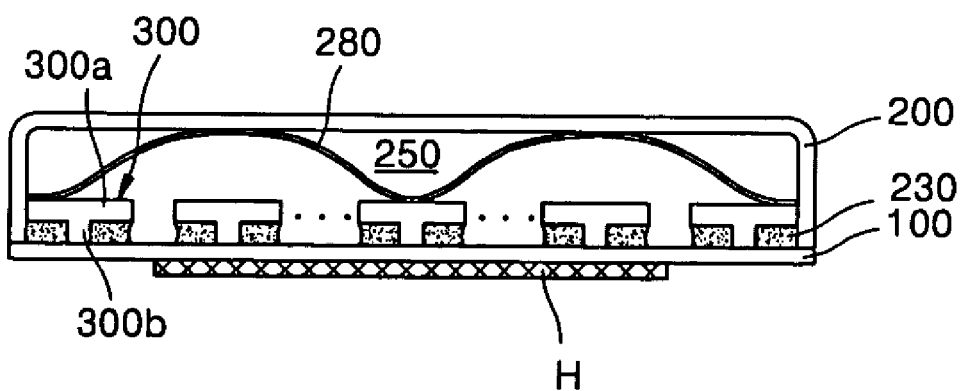

FIG. 24 shows a case in which the elastic element 280 is formed between the first upper plate 200 and the fourteenth planar wicks 300 as the means for preventing the fourteenth planar wicks 300 from moving in a direction perpendicular to the first lower plate 100.

Figure 25:
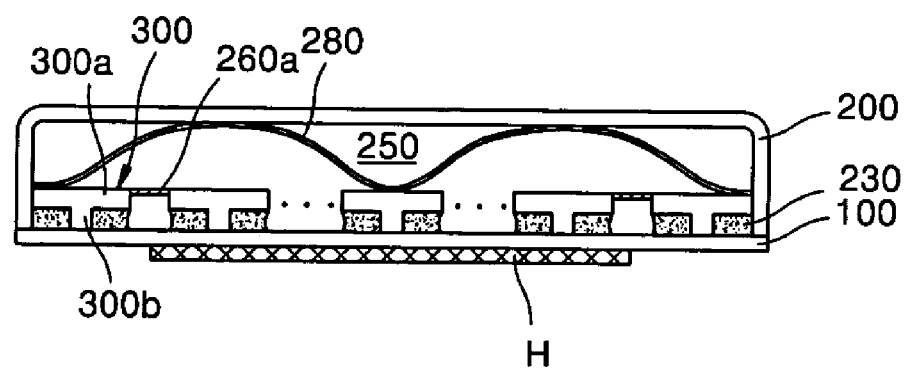

FIG. 25 shows a case in which the elastic element 280 and the planar wick bridge 260a are provided in the substantially flat heat transferring device including the fourteenth planar wicks 300.

A substantially flat heat transferring device, which does not include a spacer plate, and its variations will be described below with reference to FIGS. 26 through 30.

Referring to FIG. 26, only the first through third planar wicks 140, 142, and 144, which constitute the planar wick forming region 120b of the wick plate 120 shown in FIG. 1, are provided between the first lower plate 100 and the first upper plate 200. The first through third planar wicks 140, 142, and 144 are arranged to be very close to the first lower plate 100. The first through third planar wicks 140, 142, 144 and the first lower plate 100 are adhered by the surface tension of the liquid-phase coolant 230 existing therebetween. The liquid-phase coolant 230 runs between the first lower plate 100 and the first through third planar wicks 140, 142, and 144 in the condensing part P2 and moves to the vaporization part P1 from the condensing part P2 due to capillary force generated between the first lower plate 100 and the first through third planar wicks 140, 142, and 144 by their adhesion.

Even though there is no spacer plate 110 between the wick plate 120 and the first lower plate 100, the liquid-phase coolant 230 can run between the first lower plate 100 and the wick plate 120. The liquid-phase coolant 230 then moves to the vaporization part P1 from the condensing part P2 through the gap between the first lower plate 100 and the first through third planar wicks 140, 142,and 144 by the capillary force and is vaporized by heat generated from the heat source H. Vapor generated in the process is emitted in the vapor moving space 250 formed between the first upper plate 200 and the first through third planar wicks 140, 142, and 144 extending to the condensing part P2 through openings formed between the first through third planar wicks 140, 142, and 144. Then, the vapor moves to the condensing part P2 via the vapor moving space 250.

Figure 27:
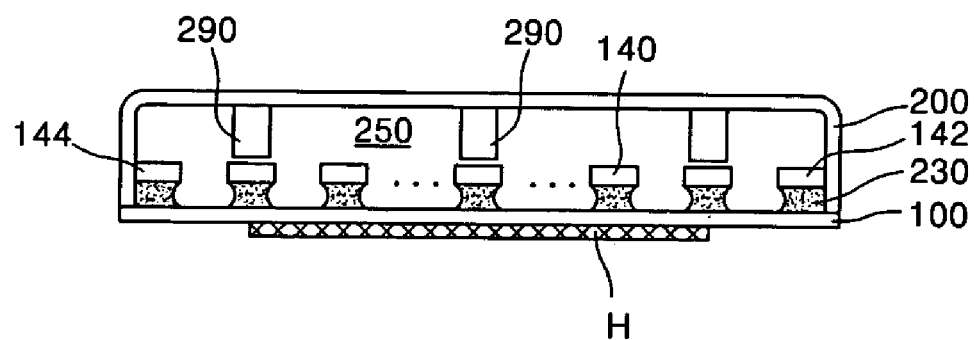

FIG. 27 shows a case in which the first protrusions 290 are provided at an inner surface of the first upper plate to face the first through third planar wicks 140, 142, and 144 in the substantially flat heat transferring device shown in FIG. 26. The first protrusions 290 are protruded toward the first through third planar wicks 140, 142, and 144. The first protrusions 190 are an auxiliary means for closely fixing the wick plate 120 to the first lower plate 100 and prevent the distance between the first lower plate 100 and the first through third planar wicks 140, 142, and 144 from being increased beyond the range in which the surface tension of the liquid-phase coolant 230 works because of external impact or other reasons. The first protrusions 290 also prevent the first upper and lower plates 200 and 100 from being bent or distorted in the process to cool the heat source H.

Figure 28:
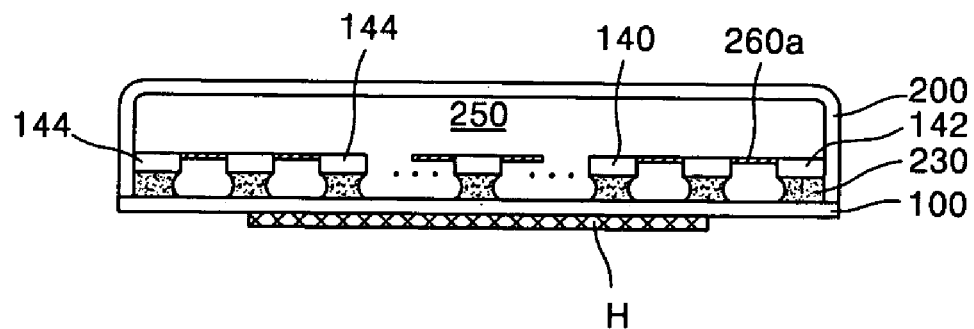

FIG. 28 shows a case in which the planar wick bridges 260a are provided among the first through third planar wicks 140, 142, and 144 in the substantially flat heat transferring device shown in FIG. 26. The planar wick bridges 260 have been described above with reference to FIGS. 13A through 13D and 14 and thus their description will be omitted here. Additionally, the first protrusions 290 shown in FIG. 27 may also be provided together with the planar wick bridges 260a in the substantially flat heat transferring device shown in FIG. 28.

Figure 29:
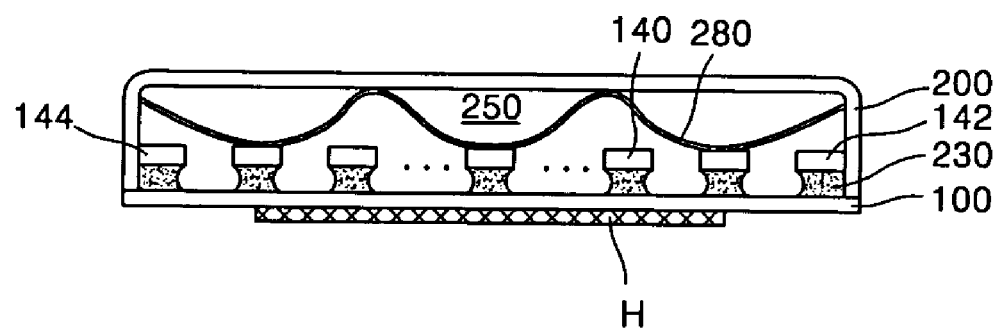

FIG. 29 shows a case in which the elastic element 280 is provided in the vapor moving space 250 of the resultant shown in FIG. 26 as an auxiliary means for fixing the wick plate 120 to the first lower plate 100. The elastic element 280 may be, for example, a plate spring, which has been mentioned above. Additionally, the planar wick bridges 260a in the form shown in FIG. 28 may also be provided between the first through third planar wicks 140, 142, 144 together with the elastic element 280.

The auxiliary means for fixing the wick plate 120, such as the planar wick bridges 260a, the elastic element 280, and the first protrusions 290 at the inner surface of the first upper plate 200, may be an individual material or be formed using metal etching. Also, the first upper plate 200 and the auxiliary means may be formed as one body using a press process.

Figure 30:
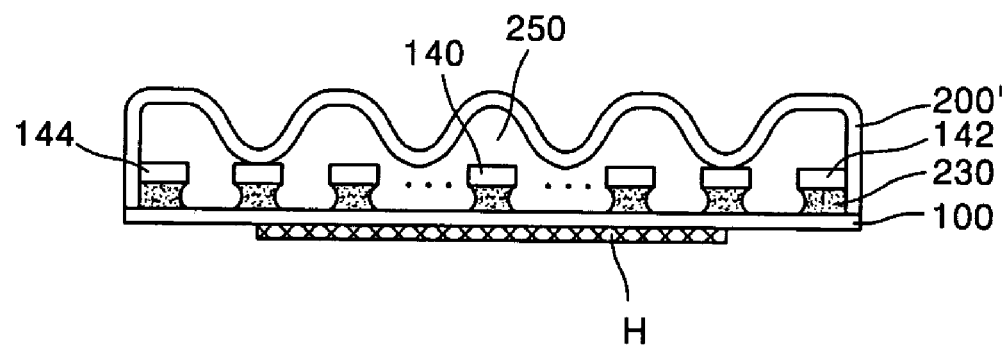

FIG. 30 shows such an example. The surface to face the wick plate 120 of a second upper plate 200' shown in FIG. 30 is uneven. Protruded parts of the second upper plate 200' contacting the first through third planar wicks 140, 142, and 144 can act as an auxiliary means for fixing the wick plate 120. The uneven part of the second upper plate 200' is formed from the vaporizing part P1 to condensing part P2. Accordingly, recessed parts between the protruded parts, which are not in contact with the first through third planar wicks 140, 142, and 144, are used as a passage through which vapor moves to the condensing part P2.

The uneven surface to face the wick plate 120 of the first upper plate 200 may be a wave shape, as shown in FIG. 30, or in a square saw tooth shape not shown.

A heat sink for condensing vapor supplied from the vaporization part P1 into liquid (e.g., a ventilation fan) is provided outside the condensing part P2 of the substantially flat heat transferring device according to the embodiments of the present invention. FIGS. 31 through 33A and 33B show the relationship between the heat sink and the substantially flat heat transferring device according to the present invention in terms of their locations. In FIGS. 31 through 33A and 33B, the substantially flat heat transferring device without an auxiliary means for fixing the wick plate 120 is used. However, a substantially flat heat transferring device including the auxiliary means for fixing the wick plate 120 may also be used. The first through third planar wicks 140, 142, and 144 are specifically not shown in FIGS. 31 through 33A and 33B for the convenience of drawing.

Figure 31:
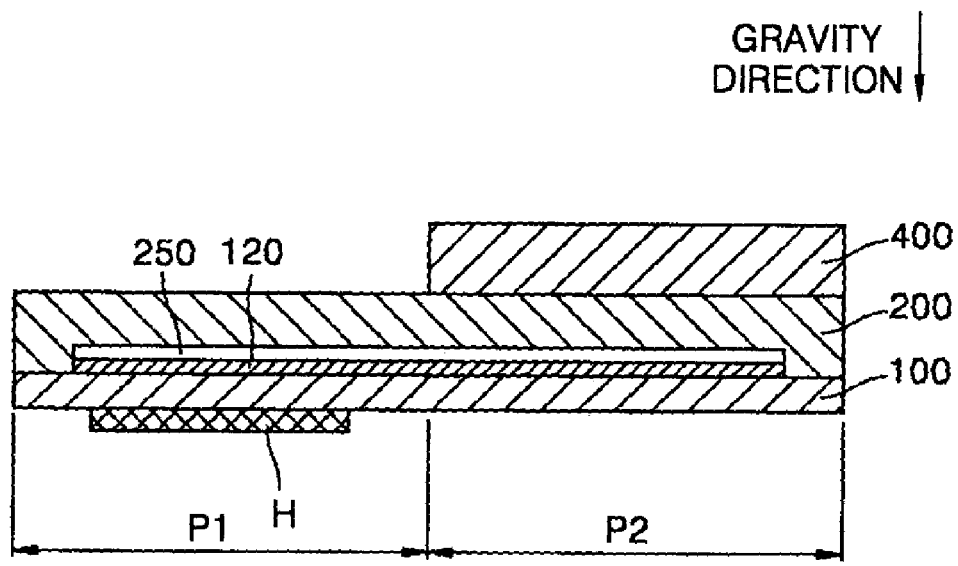

FIG. 31 shows a heat sink 400 mounted on a predetermined region of the first upper plate 200 corresponding to the condensing part P1.

Figure 32:
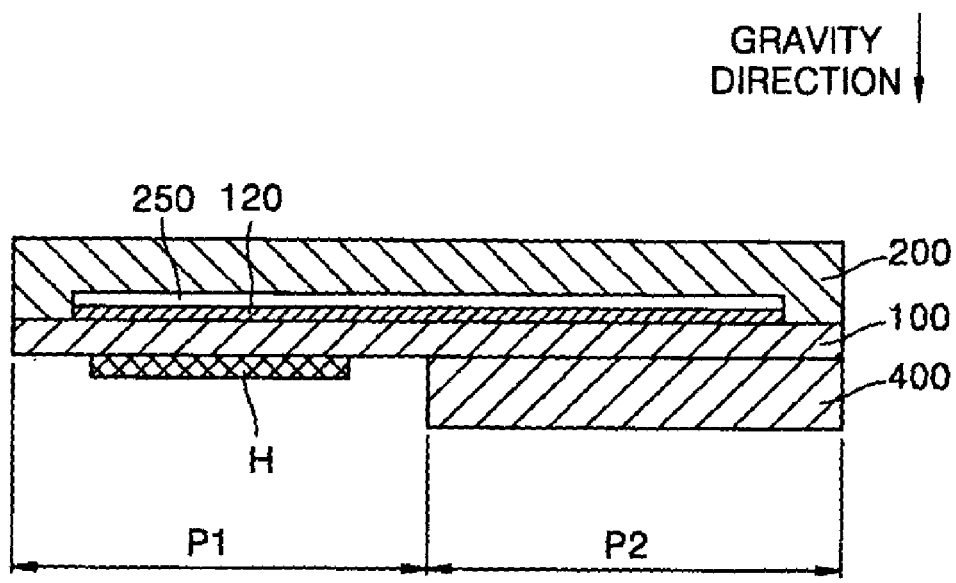

FIG. 32 shows a heat sink 400 attached to the bottom surface of the first lower plate 100 together with the heat source H. In FIG. 32, the heat sink 400 is attached to the bottom surface of the first lower plate 100 corresponding to the condensing part P2. Part of the first lower plate 100 onto which the heat sink 400 is attached may be thinner than the rest of the first lower plate 100.

Figure 33A:
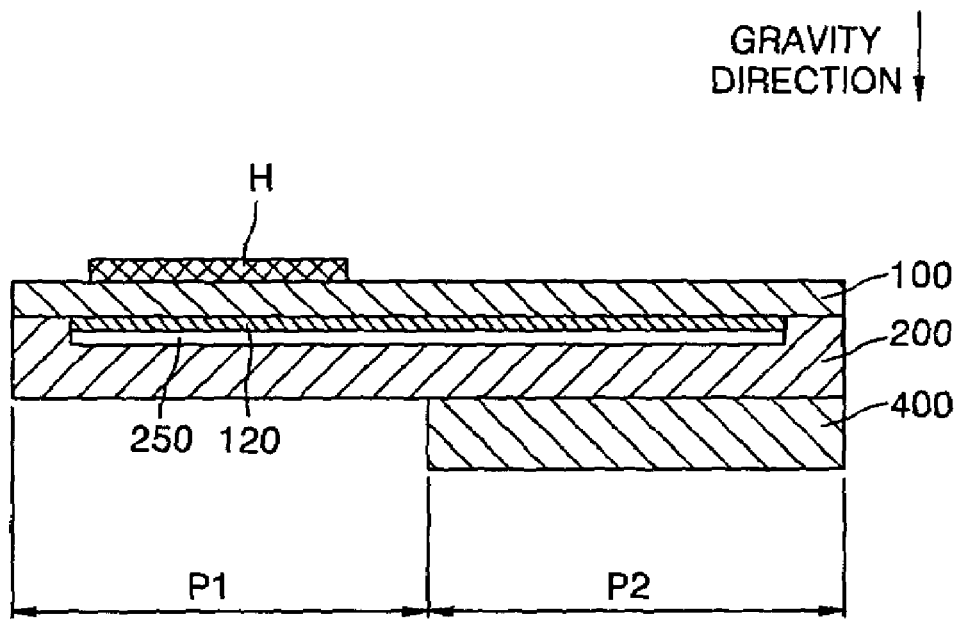
Figure 33B:
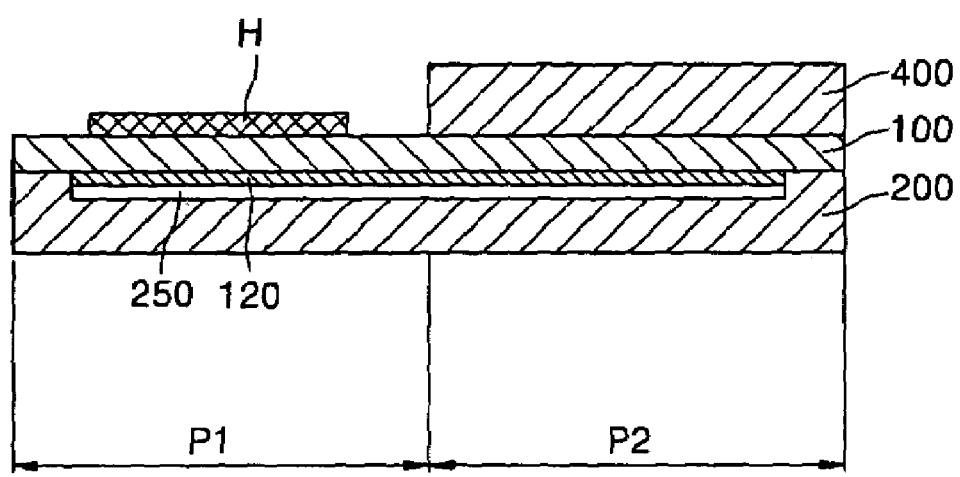

The substantially flat heat transferring devices shown in FIGS. 33A and 33B are the same as an upside-down image of the substantially flat heat transferring device shown in FIG. 31. In FIGS. 33A and 33B, the first lower plate 100 is located at an upper part of the substantially flat heat transferring device as an upper plate, the first upper plate 200 at a lower part as a lower plate, and the heat source H (e.g., a chip emitting heat) is attached to the upper surface of the substantially flat heat transferring device. FIGS. 33A and 33B may represent a case where the substantially flat heat transferring device shown in FIG. 31 is turned upside down. Accordingly, the heat source H is located on a predetermined part of the first lower plate 100, which is used as the upper plate, corresponding to the vaporization part P1. The heat sink 400 may be attached to a predetermined part of the first upper part 200, which is used as the lower plate, corresponding to the condensing part P2, as shown in FIG. 33A. Alternatively, the heat sink 400 may be located together with the heat source H on the first lower plate 100, as shown in FIG. 33B, in which case the wick plate 120 is almost like dangling from the first lower plate 100 and thus is affected by gravity in a downward direction. Even though the wick plate 120 can be maintained to be maintained in position relative to the first lower plate 100 by the surface tension of a liquid-phase coolant existing between the wick plate 120 and the first lower plate 100, the position of the wick plate 120 and the first lower plate 100 may be much more unstable than in the previous embodiments of the present invention.

Accordingly, auxiliary means may be provided for fixing the wick plate 120 to the first lower plate 100 in the vapor moving space 250. In addition, in order to make the liquid-phase coolant smoothly flow, the wick plate 120 may be extended to the bottom of the predetermined part of the first upper plate 200, which is used as the lower plate, corresponding to the heat sink 400.

Figure 34:
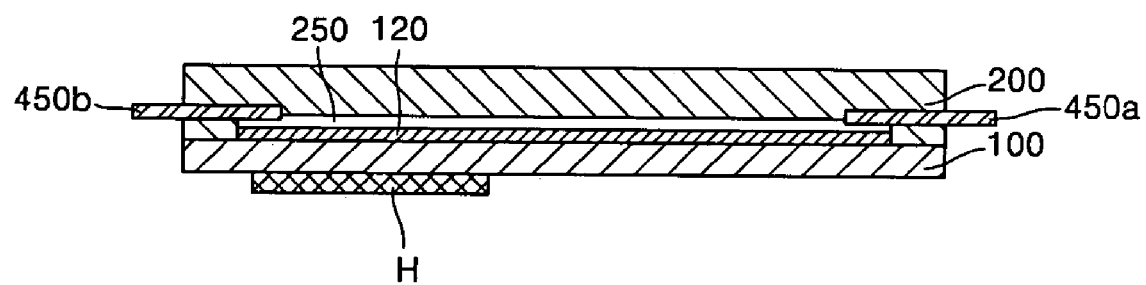
FIG. 34 is a cross-sectional view of an exemplary embodiment of the heat transferring device shown in FIG. 31, in which a fill port is provided.

In the substantially flat heat transferring devices shown in FIGS. 31 through 33A and 33B, a plurality of smaller-sized heat sinks, which can be arbitrarily controlled, may be provided instead of the heat sink 400. The liquid-phase coolant is injected into a substantially flat heat transferring device in the last step of manufacturing the substantially flat heat transferring device. In order to inject the liquid-phase coolant into the substantially flat heat transferring device, a fill port having an arbitrary shape (e.g., a circular tube shape) is provided to either the first upper plate 200 or the first lower plate 100 or both of the two. FIG. 34 shows a substantially flat heat transferring device including a fill port. As shown in FIG. 34, a fill port is provided to either end of the first upper plate 200. In other words, a first fill port 450a is installed at a side wall of the first upper plate 200 around the condensing part P2, and a second fill port 450b is installed at the other end of the first upper plate 200 in the vaporization part P1.

Figure 35:
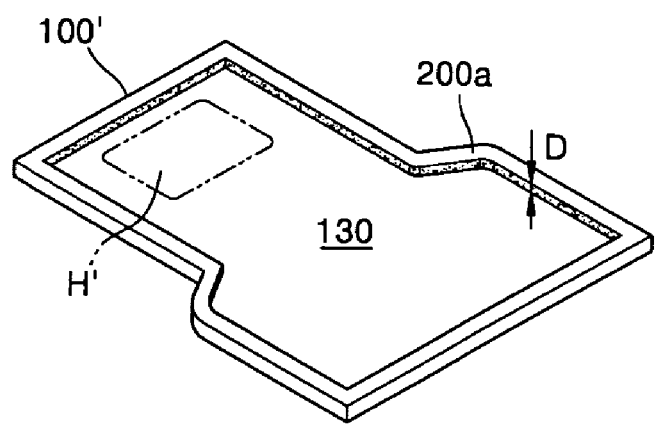
FIG. 35 is a perspective view of an exemplary embodiment of the second lower plate of the present invention in which a region where a wick plate will be installed is recessed to a predetermined depth.

The first lower plate 100 which has been described above has an even top surface and a uniform thickness. However, as shown in FIG. 35, in an alternative embodiment, there may be a second lower plate 100' in which a region 130 where the wick plate 120 or the spacer plate 110 is mounted is formed to depth D, which is deeper than a region 200a contacting the edge of the upper plate 200. In the case of the second lower plate 100', the thickness of the region 130 is thinner than that of the region 200a contacting with the edge of the first upper plate 200. Hereinafter, a substantially flat heat transferring device including the second lower plate 100' will be described. In the substantially flat heat transferring device, only the wick plate 120 is between the second lower plate 100' and the first upper plate 200. However, the substantially flat heat transferring device may further include the spacer plate 110 together with the wick plate 120.

Figure 36:
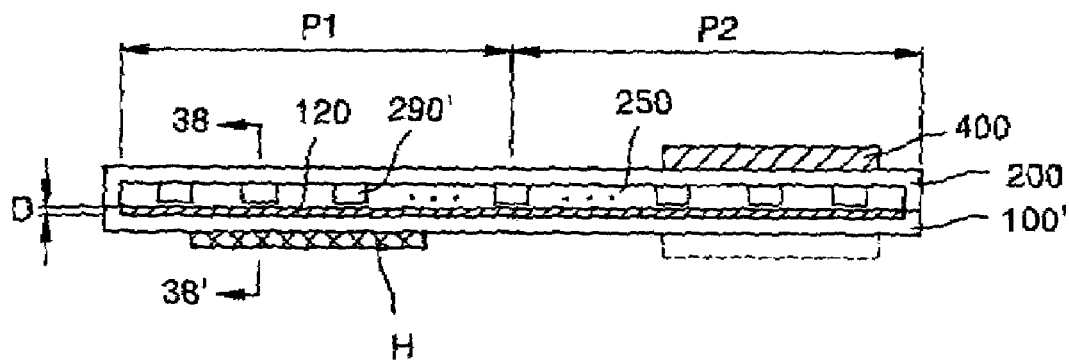
FIGS. 36 and 37 are cross-sectional views of exemplary embodiments of a substantially flat heat transferring device having the second plate shown in FIG. 35, taken along the direction crossing vaporizing and condensing parts.

FIG. 36 is a cross-sectional view of a substantially flat heat transferring device including the second lower plate 100'. Here, second protrusions 290' are formed at the inner surface of the first upper plate 200 facing the wick plate 120 as a means for fixing the wick plate 120. The second protrusions 290' are the same as the first protrusions 290 in terms of their functions, and thus their description will be omitted. The heat sink 400 may be formed on a predetermined area of the first upper plate 200 corresponding to the condensing part P2. However, the heat sink 400 may also be attached to the bottom surface of the second lower plate 100', as marked by a dotted line in FIG. 37. The first upper plate 200 and the second lower plate 100' may be coupled to each other using various kinds of coupling methods (e.g., welding, electrostatic coupling, or thermal coupling). This fact can also apply to the coupling of a upper plate and a lower plate described below.

Figure 37:
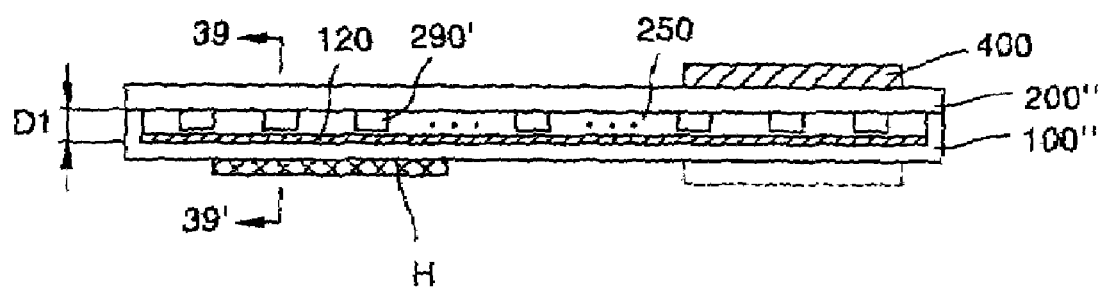

FIG. 37 is a cross-sectional view of a substantially flat heat transferring device including a third lower plate 100" and a third upper plate 200". In FIG. 37, a certain region 130 of the third lower plate 100" where the wick plate 120 will be mounted is recessed to a second depth D1, and the third upper plate 200" is substantially flat having a uniform thickness. The D1 is larger than the D2. The vapor moving space 250 is provided by the third lower plate 100", which is recessed to the second depth D1 except for the edge. A void, i.e., the vapor moving space 250, is provided between the third upper plate 200" and the wick plate 120. Unlike in the previous embodiments of the present invention, the thickness of the third upper plate 200" is uniform, the vapor moving space 250 is provided by the third lower plate 100" in which the rest except the edge is recessed to the second depth D1. The second protrusions 290' are formed in the vapor moving space 250. A dotted line in FIG. 37 is for showing that the heat sink 400 which is mounted on the predetermined area of the third upper plate 200" corresponding to the condensing part P2 can also be attached to the bottom surface of the third lower plate 100'.

Figure 38:
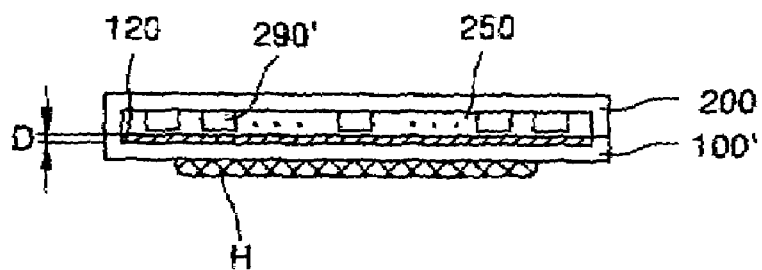
FIG. 38 is a cross-sectional view of the substantially flat heat transferring device shown in FIG. 36, taken along line 38–38' of FIG. 36.
Figure 39:
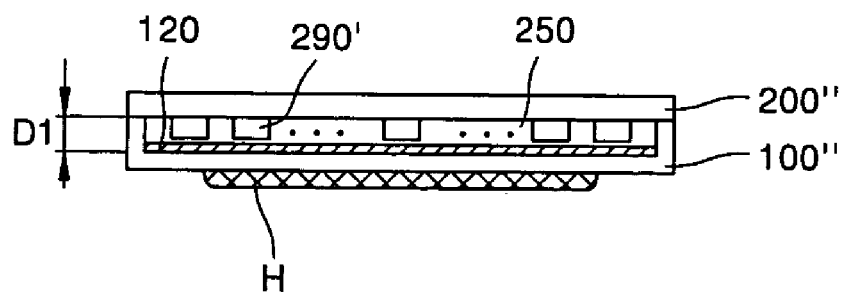
FIG. 39 is a cross-sectional view of the substantially flat heat transferring device shown in FIG. 37, taken along line 39–39' of FIG. 37.

FIG. 38 is a cross-sectional view of the substantially flat heat transferring device shown in FIG. 36, taken along line 38-38', and FIG. 39 is a cross-sectional view of the substantially flat heat transferring device shown in FIG. 37, taken along line 39-39'. In FIGS. 38 and 39, the planar wick bridges 260a shown in FIG. 28 or the elastic element 280 shown in FIG. 29 may be included instead of the second protrusions 290' as an auxiliary means for fixing the wick plate 120. This fact can also be applied to FIGS. 40 and 41.

Figure 40:
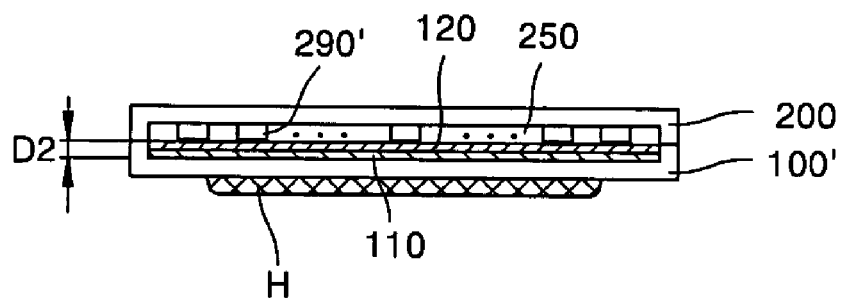
FIG. 40 is a cross-sectional view of an exemplary embodiment of the substantially flat heat transferring device shown in FIG. 39.
Figure 41:
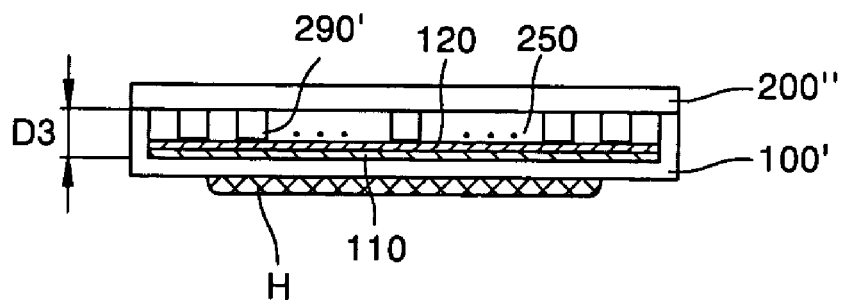
FIG. 41 is a cross-sectional view of the substantially flat heat transferring device shown in FIG. 39.

In FIGS. 38 and 39, the spacer plate 110 may be further included between the wick plate 120 and either the second or third lower plates 100' or 100". FIG. 40 shows a case in which the spacer plate 110 is provided between the wick plate 120 and the second lower plate 100', and FIG. 41 shows a case in which the spacer plate 110 is provided between the wick plate 120 and the third lower plate 100". In the former, the rest except the edge of the second lower plate 100' is recessed to a third depth D2 (D2>D) in consideration of the thickness of the spacer plate 110. In the latter, the rest except the edge of the third lower plate 100" is recessed to a fourth depth D3 (D3>D1>D2) in consideration of the thickness of the spacer plate 110.

The spacer plate 110 shown in FIGS. 40 and 41 may have different shape and size from the wick plate 120. For example, the spacer plate 110 may be a plate formed in an arbitrary shape having a plurality of holes, in which case the size of the holes may be larger than the size of holes formed in the wick plate 120.

The spacer plate 110 may also be replaced by a plurality of spacers having a simple structure which does not affect the movement of a liquid-phase coolant.

The wick plate 120 is comprised of planar wicks and holes between the planar wicks. The shape and arrangement of the planar wicks are dependent on the shape and arrangement of the holes. Accordingly, the direction of the movement of the liquid-phase coolant from the condensing part P2 to the vaporization part P1 is also dependent on the holes. As in each of the previous embodiments of the present invention, the way the holes are arranged is determined in consideration of the direction of the movement of the liquid-phase coolant.

Figure 42:
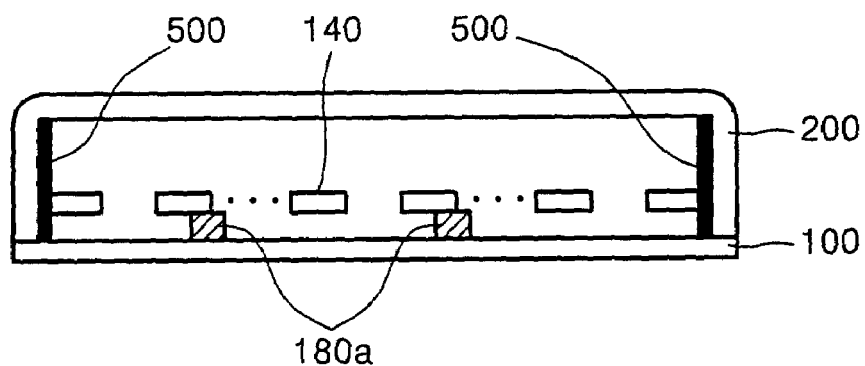
FIGS. 42 and 43 are a cross-sectional view and a plan view, respectively, of a substantially flat heat transferring device according to an exemplary embodiment of the present invention, including an upper plate where the upper plate including vertical spacers are provided.
Figure 43:
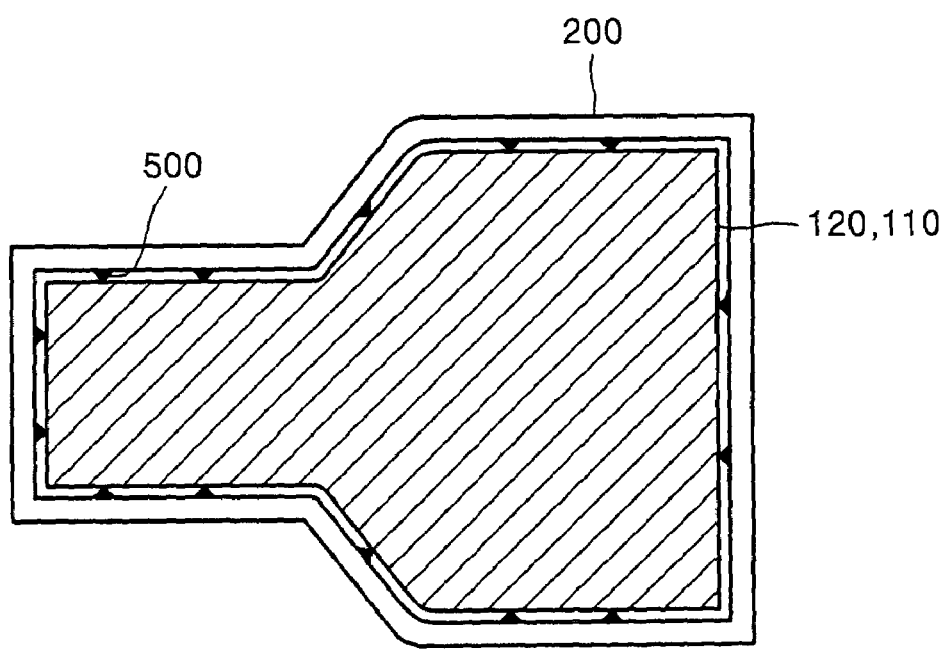

The substantially flat heat transferring device according to an embodiment of the present invention may further include vertical spacers 500, as shown in FIGS. 42 and 43 at the inner sidewalls of the upper plate 200. The vertical spacers 500 are introduced to maintain a fine gap between the upper plate 200 and elements provided in a space surrounded by the upper plate 200 and the lower plate 100, i.e., the wick plate 120.

If the elements in the space defined by the upper plate 200 and the lower plate 100 contact the inner surface of the upper plate 200, there is some possibility of a bonding agent, which is used to hermetically seal the upper plate 200 and the lower plate 100, permeating the bonded body of the lower plate 100 and the upper plate 200 along the surface of the lower plate 100. For this reason, the vertical spacers 500 are provided at the inner sidewalls of the upper plate 200, thus guaranteeing a gap between the upper plate 200 and the elements therein. Accordingly, the bonding agent can be prevented from permeating inside the bonded body of the lower plate 100 and the upper plate 200.

In the heat transferring device according to the present invention, the first spacers 180a and the lower plate 100 may be integrated into one body (hereinafter, referred to as a first embodiment) or the first protrusions 290 provided at the inner surface of the upper plate 200 and the wick plate 120 may be integrated into one body (referred to as a second embodiment), as shown in FIG. 18. Alternatively, predetermined patterns may be formed at the surface of the lower plate 100 in order to expand the contact area between the liquid-phase coolant and the lower plate 100 in the vaporization part P1 (referred to as a third embodiment). Alternatively, an auxiliary means for helping transfer the liquid-phase coolant from the condensing part P2 to the vaporization part P1 may be provided at the surface of the lower plate 100 so that the liquid-phase coolant can be transferred via the auxiliary means (referred to as a fourth embodiment). Alternatively, the upper and lower plates 200 and 100 may be each constituted by two different elements (referred to as a fifth embodiment).

Figure 44:
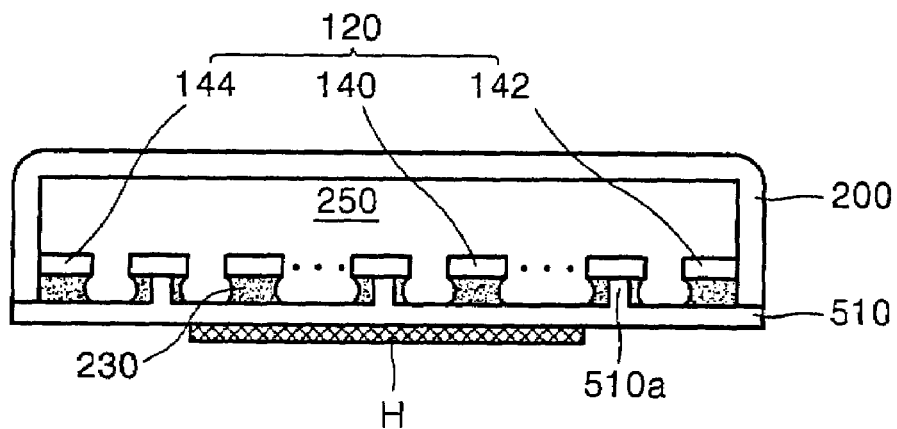
FIGS. 44 and 45 are a cross-sectional view and a perspective view, respectively, of a substantially flat heat transferring device according to an exemplary embodiment of the present invention, including a lower plate which is integrated into one body with spacers.
Figure 45:
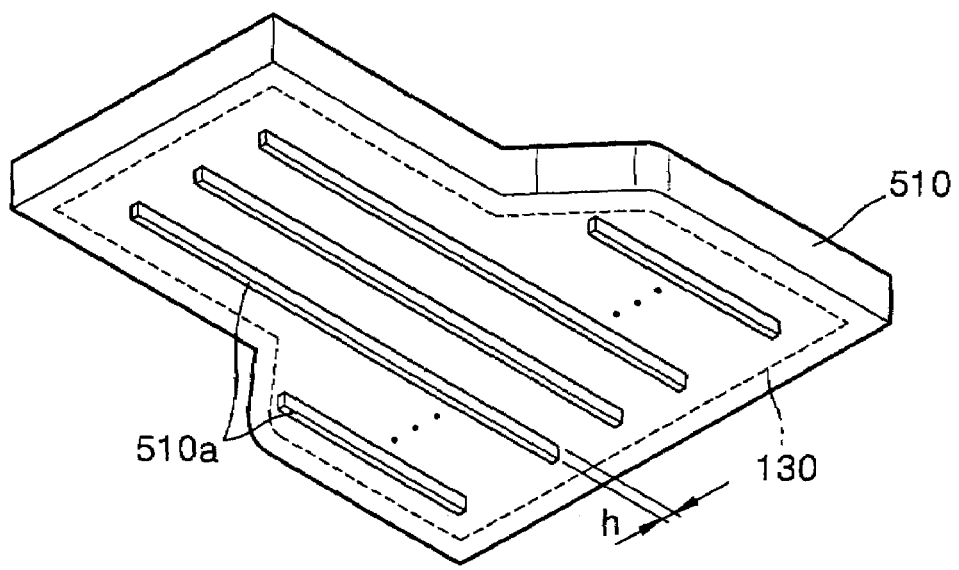

FIG. 44 is a cross-sectional view of a heat transferring device according to the first embodiment of the present invention. In FIG. 44, reference numerals 510 and 510a represent a lower plate, integrated into one body with spacers, and spacer protrusions, provided on the lower plate 510, respectively. The spacer protrusions 510a serve almost the same functions as the first spacers 180, shown in FIGS. 10 and 12, and have the same height (h) as the thickness of the first spacers 180a. The spacer protrusions 510a may have different heights region by region, which is similar to the cases dealt with in FIGS. 11B and 11C. For example, the spacer protrusions 510 may be formed so that the height of the spacer protrusions 510 in the condensing part P2 is larger than the height of the spacer protrusions 510 in the vaporization part P1. The height of the spacer protrusions 510 may regularly or irregularly decrease over the lower plate 510 ranging from the condensing part P2 to the vaporization part P1. The spacer protrusions 510a, as shown in FIG. 45, may be arranged along the direction of the length of the lower plate 510.

Figure 46:
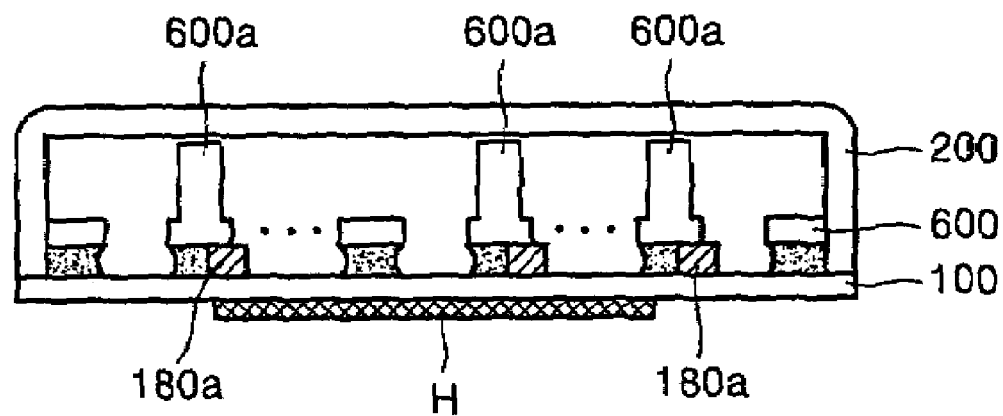
FIG. 46 is a cross-sectional view of a substantially flat heat transferring device according to an exemplary embodiment of the present invention, including a wick plate and a wick plate control means for preventing the wick plate from vertically moving, which are integrated into one body.

FIG. 46 is a cross-sectional view of a heat transferring device according to another exemplary embodiment of the present invention. In FIG. 46, reference numeral 600 represents a control mean-integrated wick plate, which is formed by integrating, into one body, the wick plate comprised of first through third planar wicks 140, 142, and 144, and the first protrusions 290, which are planar wick control means for preventing the first through third planar wicks 140, 142, and 144, shown in FIGS. 18 and 19, from moving in a vertical direction. Reference numeral 600a represents protrusions (referred to as wick plate protrusions) protruding upward from the control mean-integrated wick plate 600. The wick plate protrusions 600a serve the same functions as the first protrusions 290, shown in FIGS. 18 and 19, may be formed to the same height as the first protrusions 290. In other words, the wick plate protrusions 600a may be formed to a predetermined height so that they do not form any gap with the inner surface of the upper plate 200. The wick plate protrusions 600a may be formed having a rectangular cross section and extending along the first through third planar wicks 140, 142, and 144. However, the wick plate protrusions 600a may have different cross sections, i.e., a circular cross section (like protrusions 290a shown in FIG. 18C) and a polygonal cross section (like protrusions 290b shown in FIG. 18D). The wick plate protrusions 600a may be formed having a smaller width than the first through third planar wicks 140, 142, and 144.

Figure 47:
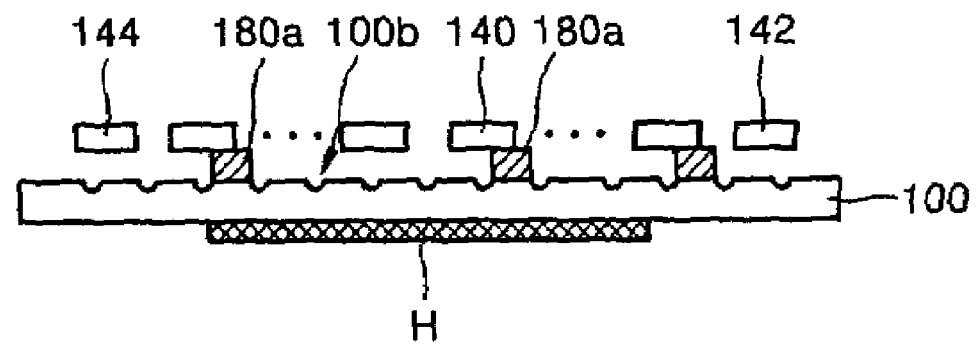
FIG. 47 is a cross-sectional view of a substantially flat heat transferring device according to an exemplary embodiment of the present invention, including micropatterns of a smaller width than planar wicks at the surface of a lower plate, the micropatterns extending along the planar wicks.
Figure 48:
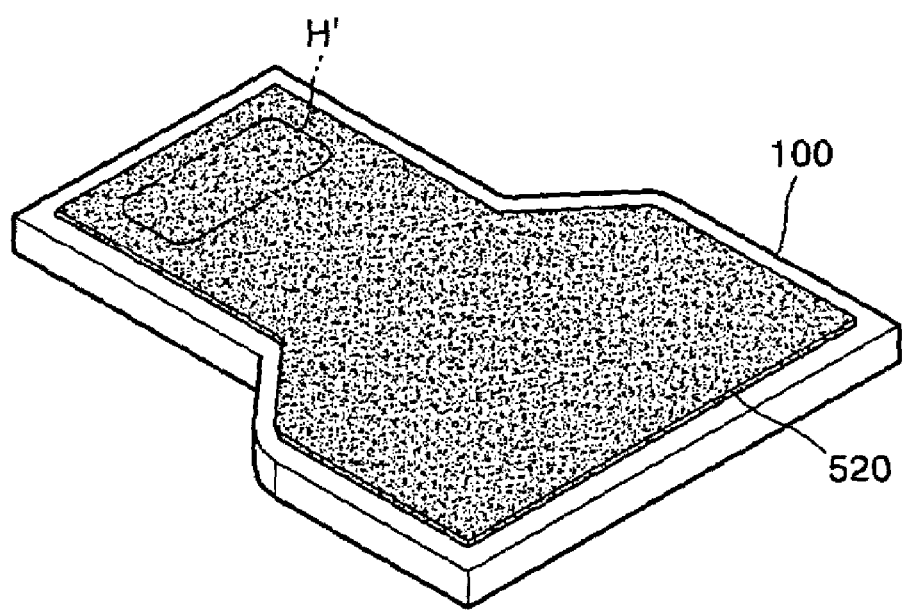
FIG. 48 is a perspective view of a substantially flat heat transferring device according to an exemplary embodiment of the present invention, in which a hydrophilic film is formed at a spacer plate region of a lower plate.

FIG. 48 is a cross-sectional view of a heat transferring device according to another exemplary embodiment of the present invention. Referring to FIG. 47, micropatterns 100b are formed at the surface of the lower plate 100. The micropatterns 100b may be provided at the vaporization part P1 or both at the vaporization part P1 and the condensing part P2. The micropatterns 100b may be formed as hemispherical shaped or equilateral triangle-shaped grooves having a smaller width than the first through third planar wicks 140, 142, and 144. The micropatterns 100b are separated from one another with a predetermined distance thereamong. The distance among the micropatterns 100b may be at least the same as the width of the first spacers 180a, in which case the first spacers 180a may be formed to contact the lower plate 100 among the micropatterns 100b.

The surface area of the lower plate 100 is expanded larger due to the existence of the micropatterns 100b. Accordingly, the contact area between the lower plate 100 and the liquid-phase coolant entering the vaporization part P1 increases, and heat capacity transferred to the liquid-phase coolant per each predetermined time unit increases considerably from the heat capacity to the liquid-phase coolant per each predetermined time unit with no micropatterns. This means that due to the existence of the micropatterns 100b, the efficiency of cooling down elements heated by the heat source H considerably increases as well.

The micropatterns 100b may be formed along the direction of the length of the lower plate 100. However, as long as the purposes of the installation of the micropatterns 100b can be successfully met, the micropatterns 100b may be formed having a variety of shapes (e.g., a spiral shape, a circular shape, and a polygonal shape).

FIG. 48 is a perspective view of a heat transferring device according to another exemplary embodiment of the present invention. Referring to FIG. 48, the top surface of the lower plate 100 is covered with hydrophilic film 520, i.e., a porous film, except for the edge of the lower plate 100, which contacts the upper plate 200. The hydrophilic film 520 is thinner than the spacer plate 110 and is formed of a different material from the upper plate 200 and the lower plate 100. The hydrophilic film 520 is used to transfer some of the liquid-phase coolant collected in the condensing part P2 to the vaporization part P1. Since the hydrophilic film 520 can carry a smaller amount of liquid-phase coolant than the wick plate 120 can, it may be hard for the hydrophilic film 520 to provide a sufficient amount of liquid-phase coolant required by the vaporization part P1 without other elements' help. For this, hydrophilic film 520 may be provided as an auxiliary means for the wick plate 120 to carry the liquid-phase coolant. Therefore, the wick plate 120 is provided on the hydrophilic film 520. The wick plate 120 may be replaced by the control means integrated wick plate 600, shown in FIG. 46. In addition, in a case where the vertical spacers 500 are provided at the inner surface of the upper plate 200, as shown in FIGS. 42 and 43, the hydrophilic film 520 can be provided.

Figure 49:
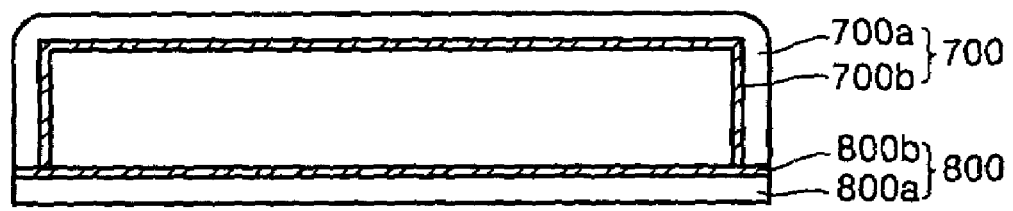
FIG. 49 is a cross-sectional view of a substantially flat heat transferring device according to an exemplary embodiment of the present invention, in which an upper plate and a lower plate are each constituted by two elements.

FIG. 49 is a cross-sectional view of a heat transferring device according to another exemplary embodiment of the present invention. This embodiment of the present invention is mainly related to the structure of upper and lower plates, and thus elements that are not directly related to the structure of the upper and lower plates, such as a spacer plate, a wick plate, and protrusions, are not illustrated in FIG. 49 for the convenience of drawing.

In FIG. 49, reference numerals 700 and 800 represent upper and lower plates, respectively, of a substantially flat heat transferring device. The upper plate 700 is comprised of an outer cover 700a and an inner cover 700b, which directly contacts a spacer plate, a wick plate, and vapor generated from a vaporization part P1. The outer cover 700a of the upper plate 700 is formed of aluminium (Al), and the inner cover 700b is formed of copper (Cu). The lower plate is comprised of an outer cover 800a, which contacts a heat source (not shown), and an inner cover 800b, which directly contacts a spacer plate (not shown) and a liquid-phase coolant. The outer cover 800a of the lower plate 800 is formed of aluminium, and the inner cover 800b is formed of copper.

The upper and lower plates 700 and 800 may be formed of different materials from those presented here, if necessary.

The hydrophilic film 520 of FIG. 48 may be provided at the surface of the inner cover 800b of the lower plate 800, shown in FIG. 49, and vertical spacers may be further provided at the inner surface of the inner cover 700b of the upper plate 700 together with or independently from the hydrophilic film 520 at the lower plate 800. Spacers of a variety of shapes may be provided on the inner cover 800b of the lower plate 800 together with a wick plate and the vertical spacers.

Hereinafter, a method of fabricating a substantially flat heat transferring device according to the present invention will be described.

Specifically, the first lower plate 100 or the first upper plate 200 of elements shown in FIG. 5 is formed first. The first upper plate, 200 at the inner surface of which an auxiliary means for fixing the wick plate 120 to the first lower plate 100, such as the protrusions 290, is formed, is manufactured using casting process, precision instrument processing process, pressing process, or embossing process. In a case where the first lower plate is the second lower plate 100' having a recessed region 130 as shown in FIG. 35. The first lower plate 100 is formed in the same manner as the first upper plate 200.

In the process of forming the first plate 100, the micropatterns 100b may be formed on the surface of the first plate 100, as shown in FIG. 47, in order to expand the surface area of the first lower plate. The micropatterns 100b may be formed as grooves, which are separated from one another with a predetermined distance thereamong. The grooves, here, may have a variety of cross sections (e.g., a hemispherical cross section or a triangular cross section). The micropatterns 100b may be formed having a smaller width than the first through planar wicks 140, 142, and 144. The micropatterns 100b may be formed having a larger width than the first spacers 180a.

As shown in FIG. 44, the spacer protrusions 510a may be formed to protrude upward from the lower plate 510, as shown in FIG. 44. The spacer protrusions 510a serve the same functions as the first spacers 180a shown in FIG. 11 or 12. Therefore, the spacer protrusions 510a may be formed to the same height as the first spacers 180a. The lower plate 510 and the spacer protrusions 510a may be integrated into one body. The height of the spacer protrusions 510a regularly or irregularly decreases over the lower plate 100 ranging from the condensing part P2 to the vaporization part P1.

In the process of forming the first upper plate 200, the vertical spacers 500 may be further formed at the inner surface of the first upper plate 200, as shown in FIGS. 42 and 43, so as to form a gap between the first upper plate 200 and the wick plate 120.

In the process of forming the upper plate 700, the inner cover 700b may be further formed on the inner surface of the outer cover 700a. The inner cover 700b of the upper plate 700 is formed of a different material from the outer cover 700a. The inner cover 800b may be further formed on the surface of the outer cover 800a facing the upper plate 700. The inner cover 800b of the lower plate 800 is formed of a different material from the outer cover 800a.

After the formation of the first upper and lower plates 200 and 100, the wick plate 120 and/or the spacer plate 110 are formed. The wick plate 120 and/or the spacer plate 110 are formed to have various planar wicks or holes having various shape and size on the assumption that a liquid-phase coolant can smoothly flow. The shapes and sizes of the planar wicks and the holes may be varied. The explanation of the planar wicks were in detail described above in connection with the constitution of a substantially flat heat transferring device. Accordingly, the explanation thereto will be omitted here. The wick plate 120 and/or the spacer plate 110 are formed using wet etching, dry etching, or punching.

In the process of forming the wick plate 120, the wick plate protrusions 600a of FIG. 46, instead of the first upper plate 200, may be formed on the wick plate 120, in which case the wick plate protrusions 600a and the wick plate 120 may be integrated into one body.

According to an exemplary embodiment of the present invention, the wick plate 120 is mounted in the region 130 of the first lower plate 100, and the first upper plate 200 is arranged over the first lower plate 100 in which the wick plate 120 is mounted. Next, the first upper plate 200 and the first lower plate 100 are coupled along their edges using brazing, welding, electrostatic coupling, or thermal coupling.

According to another exemplary second embodiment of the present invention, the spacer plate 110 and the wick plate 120 are sequentially mounted in the region 130 of the first lower plate 100. Next, the first upper plate is arranged over the first lower plate 100 in which the spacer plate 100 and the wick plate 120 are sequentially mounted. Next processes are the same as the first embodiment of the present invention.

In the exemplary embodiments of the present invention described immediately above, the elastic element 290 may also be provided between the first upper plate 200 and the wick plate 120, or the first upper plate 200 may be formed so that it can be integrated into one body having both functions as an auxiliary means for fixing the wick plate 120 and an upper plate, for example, the second upper plate 200', as shown in FIG. 30.

In the exemplary embodiments of the present invention described immediately above, after the coupling of the first upper and lower plates 200 and 100, a liquid-phase coolant, for example, water (e.g., distilled water), ethanol, methanol, or acetone, is injected onto the wick plate 120 through a fill porter formed at either the first upper plate 200 or the first lower plate 100 or at both of the first upper and lower plates 200 and 100. Next, the fill port is hermetically sealed.

In an exemplary embodiment of the present invention, the wick plate 120 may be formed to also be capable of serving as the spacer plate 110 of the second embodiment of the present invention. For example, at least some of the planar wicks formed in the wick plate 120 may be formed to have protrusions extending down toward the first lower plate 100. The protrusions may be formed to have a predetermined length so that the surface tension of the liquid-phase coolant can be maintained between the first lower plate 100 and the wick plate 120 when the wick plate 120 is mounted on the first lower plate 100. By the protrusions, the first lower plate 100 can be maintained apart from the wick plate 120 by a constant distance.

As shown in FIG. 47, before mounting a wick plate (not shown) on the first lower plate 100, the hydrophilic film 520 may be formed on the surface of the first lower plate 100, on which the wick plate will be mounted.

While this invention has been particularly shown and described with reference to exemplary embodiments thereof, it will be understood by those skilled in the art that various changes in form and details may be made therein without departing from the spirit and scope of the invention as defined by the appended claims. For example, a means for pressing a wick plate may be provided to an upper plate. An integrated wick plate, in which planar wicks, spacers, and the pressing means are integrated, may be provided. For example, an integrated wick plate in which protrusions are formed on the fourteenth planar wick 300 shown in FIG. 20 or 21 may be suggested. At this time, the protrusions are symmetrical with the supporter 300b and extended toward the first upper plate 200. The protrusions in the integrated wick plate may replace the first protrusions 290 shown in FIG. 22 or the second protrusions 290'.

As described above, the substantially flat heat transferring device according to the present invention includes a wick plate and/or a spacer plate formed for an ultra slim device using a metal etching. The wick plate and the spacer plate are formed using metal etching. Accordingly, it is possible to say that the manufacturing processes are very simple and the manufacturing costs are much lower than in conventional techniques. In addition, it is possible to manufacture a wick structure which is formed to have an optimal shape for both a vaporization part and a condensing part having a relatively large area in consideration of a vaporizing region and vaporization thermal resistance. Accordingly, it is possible to apply the substantially flat heat transferring device of the present invention to various ultra slim devices and to increase the efficiency of cooling heat-generating elements.

What is claimed is:

1. A substantially flat heat transferring device, which includes a vaporization part where a liquid-phase coolant is vaporized and a condensing part where vapor generated in the vaporization part condenses into liquid, the liquid-phase coolant moving from the condensing part to the vaporization part by capillary force, the substantially flat heat transferring device comprising:
    a lower plate, the bottom of which contacts a heat source;
    an upper plate which is hermetically coupled with the lower plate along its edge to form a void therebetween;
    a wick plate which is provided between the upper plate and the lower plate and is maintained in position relative to the lower plate by surface tension of the liquid-phase coolant; and
    a liquid-phase coolant which transfers heat transferred from the heat source from the vaporization part to the condensing part circulating between the vaporization part and the condensing part,
    wherein the wick plate includes a plurality of holes and a plurality of planar wicks and makes the liquid-phase coolant flow from the condensing part to the vaporization part by capillary force between itself and the lower plate.

2. The substantially flat heat transferring device of claim 1, a spacer plate which includes a plurality of spacers for maintaining a gap between the lower plate and the wick plate is further provided between the lower plate and the wick plate where the capillary force exists.

3. The substantially flat heat transferring device of claim 1, wherein protrusions facing the lower plate are formed on some of the planar wicks in order to uniformly maintain the gap between the lower plate and the wick plate.

4. The substantially flat heat transferring device of any of claims 1 through 3, wherein protrusions are formed at a surface of the upper plate facing the wick plate in order to maintain the wick plate in position relative to the lower plate.

5. The substantially flat heat transferring device of any of claims 1 through 3, wherein in order to maintain the wick plate in position relative to the lower plate, an elastic element is provided between the upper plate and the wick plate.

6. The substantially flat heat transferring device of claim 5, wherein the elastic element is a plate spring.

7. The substantially flat heat transferring device of any of claims 1 through 3, wherein the upper plate is embossed to have recessed parts and raised parts, and the recessed parts, which are parts raised toward the wick plate, of the upper plate contact some of the planar wicks to maintain the wick plate in position relative to the lower plate.

8. The substantially flat heat transferring device of any of claims 1 through 3, wherein the plurality of holes formed in the wick plate are arranged in straight lines, a radial pattern, or a mesh pattern so that the liquid-phase coolant can smoothly move.

9. The substantially flat heat transferring device of claim 4, wherein the plurality of holes formed in the wick plate are arranged in a straight-line pattern, a radial pattern, or a mesh pattern.

10. The substantially flat heat transferring device of claim 5, wherein the plurality of holes formed in the wick plate are arranged in a straight-line pattern, a radial pattern, or a mesh pattern.

11. The substantially flat heat transferring device of claim 7, wherein the plurality of holes formed in the wick plate are arranged in a straight-line pattern, a radial pattern, or a mesh pattern.

12. The substantially flat heat transferring device of any of claims 1 through 3, wherein a bridge is formed between at least some of the plurality of planar wicks.

13. The substantially flat heat transferring device of claim 4, wherein a bridge is formed between at least some of the plurality of planar wicks.

14. The substantially flat heat transferring device of claim 5, wherein a bridge is formed between at least some of the plurality of planar wicks.

15. The substantially flat heat transferring device of claim 7, wherein a bridge is formed between at least some of the plurality of planar wicks.

16. The substantially flat heat transferring device of claim 8, wherein if the plurality of holes are arranged in a straight-line pattern or a radial-pattern, a bridge is formed between at least some of the plurality of planar wicks.

17. The substantially flat heat transferring device of claim 2, wherein a bridge is formed between the plurality of spacers.

18. The substantially flat heat transferring device of claim 17, wherein protrusions are formed at an inner surface of the upper plate facing the wick plate in order to maintain the wick plate in position relative to the lower plate.

19. The substantially flat heat transferring device of claim 17, wherein in order to maintain the wick plate in position relative to the lower plate, an elastic element is provided between the upper plate and the wick plate so that the vapor generated in the vaporization part can smoothly move.

20. The substantially flat heat transferring device of claim 17, wherein the upper plate is embossed to have recessed parts and raised parts, and the recessed parts, which are parts raised toward the wick plate, of the upper plate contact some of the planar wicks.

21. The substantially flat heat transferring device of claim 17, wherein the plurality of holes formed in the wick plate are arranged in a straight-line pattern, a radial pattern, or a mesh pattern.

22. The substantially flat heat transferring device of claim 21, wherein if the plurality of holes are arranged in a straight-line pattern or a radial pattern, a bridge is formed between at least some of the planar wicks.

23. The substantially flat heat transferring device of any of claims 1 through 3, wherein a heat sink is provided outside the condensing part for condensing the vapor.

24. The substantially flat heat transferring device of claim 4, wherein a heat sink is provided outside the condensing part for condensing the vapor.

25. The substantially flat heat transferring device of claim 5, wherein a heat sink is provided outside the condensing part for condensing the vapor.

26. The substantially flat heat transferring device of claim 7, wherein a heat sink is provided outside the condensing part for condensing the vapor.

27. The substantially flat heat transferring device of claim 8, wherein a heat sink is provided outside the condensing part for condensing the vapor.

28. The substantially flat heat transferring device of claim 23, wherein a bridge is formed between at least some of the plurality of planar wicks.

29. The substantially flat heat transferring device of claim 17, wherein a heat sink is provided outside the condensing part for condensing the vapor.

30. The substantially flat heat transferring device of any of claims 1 through 3, wherein the inside part of the lower plate which is not in contact with the upper plate is recessed to a predetermined depth.

31. The substantially flat heat transferring device of claim 4, wherein the inside part of the lower plate which is not in contact with the upper plate is recessed to a predetermined depth.

32. The substantially flat heat transferring device of claim 5, wherein the inside part of the lower plate which is not in contact with the upper plate is recessed to a predetermined depth.

33. The substantially flat heat transferring device of claim 7, wherein the inside part of the lower plate which is not in contact with the upper plate is recessed to a predetermined depth.

34. The substantially flat heat transferring device of claim 30, wherein the plurality of holes formed in the wick plate are arranged in a straight-line pattern, a radial pattern, or a mesh pattern.

35. The substantially flat heat transferring device of claim 34, wherein if the plurality of holes are arranged in a straight-line pattern or a radial pattern, a bridge is formed between at least some of the plurality of planar wicks.

36. The substantially flat heat transferring device of claim 17, wherein the inside part of the lower plate which is not in contact with the upper plate is recessed to a predetermined depth.

37. The substantially flat heat transferring device of claim 30, wherein a heat sink is provided outside the condensing part for condensing the vapor.

38. The substantially flat heat transferring device of claim 1, 2, or 3 further comprising vertical spacers, which are formed at the inner sidewalls of the upper plate to form a gap between the upper plate and elements surrounded by the upper plate.

39. The substantially flat heat transferring device of claim 4 further comprising vertical spacers, which are formed at the inner sidewalls of the upper plate to form a gap between the upper plate and elements surrounded by the upper plate.

40. The substantially flat heat transferring device of claim 4, wherein the protrusions are formed having a rectangular cross section, a circular cross section, or a polygonal cross section.

41. The substantially flat heat transferring device of claim 1, wherein the lower plate is a spacer integrated lower plate, which is formed by integrating the wick plate and the spacer protrusions, provided to maintain a uniform gap between the wick plate and the lower plate, into one body.

42. The substantially flat heat transferring device of claim 41 further comprising vertical spacers, which are formed at the inner sidewalls of the upper plate to form a gap between the upper plate and elements surrounded by the upper plate.

43. The substantially flat heat transferring device of claim 2, wherein the height of the spacer protrusions extending from the spacer integrated lower plate gradually decreases over the spacer integrated lower plate ranging from the condensing part to the vaporization part.

44. The substantially flat heat transferring device of claim 41, wherein the height of the spacer protrusions extending from the spacer integrated lower plate gradually decreases over the spacer integrated lower plate ranging from the condensing part to the vaporization part.

45. The substantially flat heat transferring device of any of claims 1 through 3, wherein protrusions, which contact the upper plate, are extended from the wick plate so as to make the wick plate firmly contact the lower plate.

46. The substantially flat heat transferring device of any of claims 1 through 3, wherein micropatterns are formed on the surface of the lower plate, having a smaller width than the planar wicks.

47. The substantially flat heat transferring device of claim 46, wherein the micropatterns are formed as grooves, isolated from one another with a predetermined distance thereamong.

48. The substantially flat heat transferring device of claim 38, wherein micropatterns are formed on the surface of the lower plate, having a smaller width than the planar wicks.

49. The substantially flat heat transferring device of claim 1 or 3, wherein a hydrophilic film is formed on the surface of the lower plate where the wick plate is to be mounted.

50. The substantially flat heat transferring device of claim 49, wherein the hydrophilic film is a porous film.

51. The substantially flat heat transferring device of claim 1, 2, 3, or 41, wherein at least either the upper or lower plate is composed of outer and inner covers of different materials.

52. The substantially flat heat transferring device of claim 38, wherein at least either the upper or lower plate is composed of outer and inner covers of different materials.

53. The substantially flat heat transferring device of claim 45, wherein at least either the upper or lower plate is composed of outer and inner covers of different materials.

54. The substantially flat heat transferring device of claim 1, wherein:
the heat transferring device has a length measured along the direction the liquid-phase coolant moves from the condensing part to the vaporization part, and a width measured perpendicular to the length along the lower plate; and
the width of the condensing part is greater than the width of the vaporization part.

55. The substantially flat heat transferring device of claim 1, wherein the plurality of planar wicks comprise:
first planar wicks extending in a straight line with a constant width from the vaporization part to the condensing part; and
second planar wicks which vary in direction and width from the vaporization part to the condensing part.

56. The substantially flat heat transferring device of claim 1, wherein the plurality of planar wicks comprise radial planar wicks extending in a radial directions from a center portion of the vaporization part.

57. The substantially flat heat transferring device of claim 2, wherein the plurality of spacers comprises:
first spacers extending in a parallel fashion from the vaporization part to the condensing part, spaced apart in the width direction by a first distance; and
second spacers extending parallel to the first spacers in the condensing part, separated from the first spacers in the width direction by a second distance which is greater than the first distance.

58. The substantially flat heat transferring device of claim 57, wherein the spacer plate further comprises a plurality of spacer plate bridges extending perpendicularly to the first and second spacers.

59. The substantially flat heat transferring device of claim 2, wherein the thickness of the plurality of wicks is greater than the thickness of the plurality of spacers.

60. The substantially flat heat transferring device of claim 2, wherein the height of the spacer protrusions extending from the spacer integrated lower plate decreases in discrete steps over the spacer integrated lower plate ranging from the condensing part to the vaporization part.

61. The substantially flat heat transferring device of claim 5, wherein the elastic element is a waveform spring extending in a width direction across the heat transferring device, and having a dimension in the length fraction small enough to prevent significant interference with the operation of the heat transferring device.

62. The substantially flat heat transferring device of claim 3, wherein the protrusions formed on some of the planar wicks and the planar wicks provide a T-shaped cross section.

63. The substantially flat heat transferring device of claim 7, wherein the embossed upper plate is embossed in a waveform shape.

64. The substantially flat heat transferring device of claim 63, wherein the waveform shape is a square wave.

65. The substantially flat heat transferring device of claim 20, wherein the embossed upper plate is embossed in a waveform shape.

66. The substantially flat heat transferring device of claim 65, wherein the waveform shape is a square waver.

67. The substantially flat heat transferring device of claim 12, wherein the bridge has a similar thickness than the plurality of planar wicks, and extends parallel to the lower plate.

68. The substantially flat heat transferring device of claim 12, wherein the bridge has a smaller thickness than the plurality of planar wicks, and extends parallel to the lower plate.

69. A method of fabricating a substantially flat heat transferring device which includes a vaporization part where a liquid-phase coolant is vaporized and a condensing part where vapor generated in the vaporization part condenses into liquid, the liquid-phase coolant moving from the condensing part to the vaporization part by capillary force, the method comprising:
(1) forming a lower plate, the bottom surface of which contacts a heat source;
(2) forming an upper plate corresponding to the lower plate so that a vapor moving space can be formed between elements mounted in the lower plate and the upper plate when coupling the lower plate with the upper plate;
(3) forming a wick plate having a plurality of planar wicks and a plurality of holes for making the liquid-phase coolant move from the condensing part to the vaporization part;
(4) mounting the wick plate in a predetermined region of the lower plate;
(5) arranging the upper plate over the lower plate in which the wick plate is mounted;
(6) coupling the upper plate with the lower plate; and
(7) injecting a liquid-phase coolant between the coupled upper plate and the lower plate,
wherein the wick plate is mounted to be positionally maintained relative to the lower plate by surface tension of the liquid-phase coolant.

70. The method of claim 69, wherein in step (1), the predetermined region of the lower plate is recessed to a predetermined depth for installment of the wick plate.

71. The method of claim 69, wherein in step (3), wick plate protrusions are formed on the wick plate toward the upper plate so that they can be integrated into one body with the wick plate.

72. The method of claim 70, wherein in step (3), wick plate protrusions are formed on the wick plate toward the upper plate so that they can be integrated into one body with the wick plate.

73. The method of claim 69, wherein in step (2), protrusions are formed at one among parts of the upper plate corresponding to the vaporization part and the condensing part so as to maintain the wick plate in position relative to the lower plate.

74. The method of claim 69 further comprising forming a spacer plate having a plurality of spacers for uniformly maintaining a gap between the wick plate and the lower plate and installing the spacer plate between the wick plate and the lower plate.

75. The method of claim 74, wherein the plurality of spacers have a gradually decreasing height so that their height is larger in the condensing part than in the vaporization part.

76. The method of claim 69 further comprising forming an elastic element for maintaining the wick plate in position relative to the lower plate and installing the elastic element between the upper plate and the wick plate.

77. The method of any of claims 69 through 76, wherein in the formation of the wick plate, a bridge is formed between at least some of the plurality of planar wicks.

78. The method of any of claims 69 through 73, wherein protrusions are formed at an inner surface facing the lower plate of one selected from the planar wicks.

79. The method of claim 74, wherein a spacer bridge is formed between at least some of the plurality of spacers.

80. The method of claim 69, wherein in step (3), the plurality of planar wicks or the plurality of holes are formed using wet etching, dry etching, or punching.

81. The method of claim 69, wherein in step (6), the upper and lower plates are coupled using welding, brazing, electrostatic coupling, or thermal coupling.

82. The method of claim 69, wherein the plurality of planar wicks or holes are arranged in a straight-line pattern, a radial pattern, or a mesh pattern.

83. The method of claim 69, wherein the upper plate corresponding to the vaporization part and the condensing part is embossed to have recessed regions and raised regions so that the vapor can smoothly move and the recessed regions protruded toward the wick plate contact at least some of the plurality of planar wicks.

84. The method of claim 69, wherein in step (1), micro-patterns are formed on the surface of the lower plate so as to expand the surface area of the lower plate.

85. The method of claim 69, wherein spacer protrusions are formed on the lower plate, protruding upward so that they can be integrated into one body with the lower plate.

86. The method of claim 85, wherein the height of spacer protrusions gradually decreases over the lower plate ranging from the condensing part to the vaporization part.

87. The method of claim 69, wherein a region of the lower plate on which the wick plate is to be mounted is covered with a hydrophilic film before mounting the wick plate on the lower plate.

88. The method of claim 87, wherein the hydrophilic film is a porous film.

89. The method of claim 69, wherein in step (2), vertical spacers are formed at the inner sidewalls of the upper plate so as to form a gap between the upper plate and the wick plate.

90. The method of claim 73, wherein the protrusions are formed having a rectangular cross section, a circular cross section, or a polygonal cross sectional.

91. The method of claim 69 further comprising forming a material layer of a different material from the material of the upper plate on the inner surface of the upper plate.

92. The method of claim 69 or 91 further comprising forming a material layer of a different material from the material of the lower plate on the entire surface of the lower plate, facing the upper plate.

93. A method of fabricating a substantially flat heat transferring device which includes a vaporization part where a liquid-phase coolant is vaporized and a condensing part where vapor generated in the vaporization part condenses into liquid, the liquid-phase coolant moving from the condensing part to the vaporization part by capillary force, the method comprising:
(1) forming a lower plate, the bottom surface of which contacts a heat source;
(2) forming an upper plate corresponding to the lower plate so that a vapor moving space can be formed between elements mounted in the lower plate and the upper plate when coupling the lower plate with the upper plate;
(3) forming a wick plate having a plurality of planar wicks and a plurality of holes for making the liquid-phase coolant move from the condensing part to the vaporization part;
(4) mounting the wick plate in a predetermined region of the lower plate;
(5) arranging the upper plate over the lower plate in which the wick plate is mounted;
(6) coupling the upper plate with the lower plate; and
(7) injecting a liquid-phase coolant between the coupled upper plate and the lower plate,
wherein in step (3), wick plate protrusions are formed on the wick plate toward the upper plate so that they can be integrated into one body with the wick plate.

94. The method of claim 93, wherein in the formation of the wick plate, a bridge is formed between at least some of the plurality of planar wicks.

95. The method of claim 93, wherein protrusions are formed at an inner surface facing the lower plate of one selected from the planar wicks.

96. A method of fabricating a substantially flat heat transferring device which includes a vaporization part where a liquid-phase coolant is vaporized and a condensing part where vapor generated in the vaporization part condenses into liquid, the liquid-phase coolant moving from the condensing part to the vaporization part by capillary force, the method comprising:
(1) forming a lower plate, the bottom surface of which contacts a heat source;
(2) forming an upper plate corresponding to the lower plate so that a vapor moving space can be formed between elements mounted in the lower plate and the upper plate when coupling the lower plate with the upper plate;
(3) forming a wick plate having a plurality of planar wicks and a plurality of holes for making the liquid-phase coolant move from the condensing part to the vaporization part;
(4) mounting the wick plate in a predetermined region of the lower plate;
(5) arranging the upper plate over the lower plate in which the wick plate is mounted;
(6) coupling the upper plate with the lower plate; and
(7) injecting a liquid-phase coolant between the coupled upper plate and the lower plate,
wherein in step (1), the predetermined region of the lower plate is recessed to a predetermined depth for installment of the wick plate, and
wherein in step (3), wick plate protrusions are formed on the wick plate toward the upper plate so that they can be integrated into one body with the wick plate.

97. The method of claim 96, wherein in the formation of the wick plate, a bridge is formed between at least some of the plurality of planar wicks.

98. The method of claim 96, wherein protrusions are formed at an inner surface facing the lower plate of one selected from the planar wicks.

99. A method of fabricating a substantially flat heat transferring device which includes a vaporization part where a liquid-phase coolant is vaporized and a condensing part where vapor generated in the vaporization part condenses into liquid, the liquid-phase coolant moving from the condensing part to the vaporization part by capillary force, the method comprising:
(1) forming a lower plate, the bottom surface of which contacts a heat source;
(2) forming an upper plate corresponding to the lower plate so that a vapor moving space can be formed between elements mounted in the lower plate and the upper plate when coupling the lower plate with the upper plate;

(3) forming a wick plate having a plurality of planar wicks and a plurality of holes for making the liquid-phase coolant move from the condensing part to the vaporization part;

(4) mounting the wick plate in a predetermined region of the lower plate;

(5) arranging the upper plate over the lower plate in which the wick plate is mounted;

(6) coupling the upper plate with the lower plate; and (7) injecting a liquid-phase coolant between the coupled upper plate and the lower plate, wherein in step (2), protrusions are formed at one among parts of the upper plate corresponding to the vaporization part and the condensing part so as to maintain the wick plate in position relative to the lower plate.

100. The method of claim 99, wherein in the formation of the wick plate, a bridge is formed between at least some of the plurality of planar wicks.

101. The method of claim 99, wherein protrusions are formed at an inner surface facing the lower plate of one selected from the planar wicks.

102. The method of claim 99, wherein the protrusions are formed having a rectangular cross section, a circular cross section, or a polygonal cross sectional.

103. A method of fabricating a substantially flat heat transferring device which includes a vaporization part where a liquid-phase coolant is vaporized and a condensing part where vapor generated in the vaporization part condenses into liquid, the liquid-phase coolant moving from the condensing part to the vaporization part by capillary force, the method comprising:

(1) forming a lower plate, the bottom surface of which contacts a heat source;

(2) forming an upper plate corresponding to the lower plate so that a vapor moving space can be formed between elements mounted in the lower plate and the upper plate when coupling the lower plate with the upper plate;

(3) forming a wick plate having a plurality of planar wicks and a plurality of holes for making the liquid-phase coolant move from the condensing part to the vaporization part;

(4) mounting the wick plate in a predetermined region of the lower plate;

(5) arranging the upper plate over the lower plate in which the wick plate is mounted;

(6) coupling the upper plate with the lower plate; and (7) injecting a liquid-phase coolant between the coupled upper plate and the lower plate, the method further comprising forming a spacer plate having a plurality of spacers for uniformly maintaining a gap between the wick plate and the lower plate and installing the spacer plate between the wick plate and the lower plate.

104. The method of claim 103, wherein in the formation of the wick plate, a bridge is formed between at least some of the plurality of planar wicks.

105. The method of claim 103, wherein protrusions are formed at an inner surface facing the lower plate of one selected from the planar wicks.

106. The method of claim 103, wherein a spacer bridge is formed between at least some of the plurality of spacers.

107. The method of claim 103, wherein the plurality of spacers have a gradually decreasing height so that their height is larger in the condensing part than in the vaporization part.

108. The method of claim 107, wherein in the formation of the wick plate, a bridge is formed between at least some of the plurality of planar wicks.

109. The method of claim 107, wherein protrusions are formed at an inner surface facing the lower plate of one selected from the planar wicks.

110. A method of fabricating a substantially flat heat transferring device which includes a vaporization part where a liquid-phase coolant is vaporized and a condensing part where vapor generated in the vaporization part condenses into liquid, the liquid-phase coolant moving from the condensing part to the vaporization part by capillary force, the method comprising:

(1) forming a lower plate, the bottom surface of which contacts a heat source;

(2) forming an upper plate corresponding to the lower plate so that a vapor moving space can be formed between elements mounted in the lower plate and the upper plate when coupling the lower plate with the upper plate;

(3) forming a wick plate having a plurality of planar wicks and a plurality of holes for making the liquid-phase coolant move from the condensing part to the vaporization part;

(4) mounting the wick plate in a predetermined region of the lower plate;

(5) arranging the upper plate over the lower plate in which the wick plate is mounted;

(6) coupling the upper plate with the lower plate; and (7) injecting a liquid-phase coolant between the coupled upper plate and the lower plate, the method further comprising forming an elastic element for maintaining the wick plate in position relative to the lower plate and installing the elastic element between the upper plate and the wick plate.

111. The method of claim 110, wherein in the formation of the wick plate, a bridge is formed between at least some of the plurality of planar wicks.

112. The method of claim 110, wherein protrusions are formed at an inner surface facing the lower plate of one selected from the planar wicks.

113. A method of fabricating a substantially flat heat transferring device which includes a vaporization part where a liquid-phase coolant is vaporized and a condensing part where vapor generated in the vaporization part condenses into liquid, the liquid-phase coolant moving from the condensing part to the vaporization part by capillary force, the method comprising:

(1) forming a lower plate, the bottom surface of which contacts a heat source;

(2) forming an upper plate corresponding to the lower plate so that a vapor moving space can be formed between elements mounted in the lower plate and the upper plate when coupling the lower plate with the upper plate;

(3) forming a wick plate having a plurality of planar wicks and a plurality of holes for making the liquid-phase coolant move from the condensing part to the vaporization part;

(4) mounting the wick plate in a predetermined region of the lower plate;

(5) arranging the upper plate over the lower plate in which the wick plate is mounted;

(6) coupling the upper plate with the lower plate; and (7) injecting a liquid-phase coolant between the coupled upper plate and the lower plate, wherein protrusions are formed at an inner surface facing the lower plate of one selected from the planar wicks.

114. A method of fabricating a substantially flat heat transferring device which includes a vaporization part where a liquid-phase coolant is vaporized and a condensing part where vapor generated in the vaporization part condenses into liquid, the liquid-phase coolant moving from the condensing part to the vaporization part by capillary force, the method comprising:
(1) forming a lower plate, the bottom surface of which contacts a heat source;
(2) forming an upper plate corresponding to the lower plate so that a vapor moving space can be formed between elements mounted in the lower plate and the upper plate when coupling the lower plate with the upper plate;
(3) forming a wick plate having a plurality of planar wicks and a plurality of holes for making the liquid-phase coolant move from the condensing part to the vaporization part;
(4) mounting the wick plate in a predetermined region of the lower plate;
(5) arranging the upper plate over the lower plate in which the wick plate is mounted;
(6) coupling the upper plate with the lower plate; and
(7) injecting a liquid-phase coolant between the coupled upper plate and the lower plate,
wherein spacer protrusions are formed on the lower plate, protruding upward so that they can be integrated into one body with the lower plate.

115. The method of claim 114, wherein the height of spacer protrusions gradually decreases over the lower plate ranging from the condensing part to the vaporization part.

116. A method of fabricating a substantially flat heat transferring device which includes a vaporization part where a liquid-phase coolant is vaporized and a condensing part where vapor generated in the vaporization part condenses into liquid, the liquid-phase coolant moving from the condensing part to the vaporization part by capillary force, the method comprising:
(1) forming a lower plate, the bottom surface of which contacts a heat source;
(2) forming an upper plate corresponding to the lower plate so that a vapor moving space can be formed between elements mounted in the lower plate and the upper plate when coupling the lower plate with the upper plate;
(3) forming a wick plate having a plurality of planar wicks and a plurality of holes for making the liquid-phase coolant move from the condensing part to the vaporization part;
(4) mounting the wick plate in a predetermined region of the lower plate;
(5) arranging the upper plate over the lower plate in which the wick plate is mounted;
(6) coupling the upper plate with the lower plate; and
(7) injecting a liquid-phase coolant between the coupled upper plate and the lower plate,
wherein a region of the lower plate on which the wick plate is to be mounted is covered with a hydrophilic film before mounting the wick plate on the lower plate.

117. The method of claim 116, wherein the hydrophilic film is a porous film.

118. A method of fabricating a substantially flat heat transferring device which includes a vaporization part where a liquid-phase coolant is vaporized and a condensing part where vapor generated in the vaporization part condenses into liquid, the liquid-phase coolant moving from the condensing part to the vaporization part by capillary force, the method comprising:
(1) forming a lower plate, the bottom surface of which contacts a heat source;
(2) forming an upper plate corresponding to the lower plate so that a vapor moving space can be formed between elements mounted in the lower plate and the upper plate when coupling the lower plate with the upper plate;
(3) forming a wick plate having a plurality of planar wicks and a plurality of holes for making the liquid-phase coolant move from the condensing part to the vaporization part;
(4) mounting the wick plate in a predetermined region of the lower plate;
(5) arranging the upper plate over the lower plate in which the wick plate is mounted;
(6) coupling the upper plate with the lower plate; and
(7) injecting a liquid-phase coolant between the coupled upper plate and the lower plate,
wherein in step (2), vertical spacers are formed at the inner sidewalls of the upper plate so as to form a gap between the upper plate and the wick plate.

119. A method of fabricating a substantially flat heat transferring device which includes a vaporization part where a liquid-phase coolant is vaporized and a condensing part where vapor generated in the vaporization part condenses into liquid, the liquid-phase coolant moving from the condensing part to the vaporization part by capillary force, the method comprising:
(1) forming a lower plate, the bottom surface of which contacts a heat source;
(2) forming an upper plate corresponding to the lower plate so that a vapor moving space can be formed between elements mounted in the lower plate and the upper plate when coupling the lower plate with the upper plate;
(3) forming a wick plate having a plurality of planar wicks and a plurality of holes for making the liquid-phase coolant move from the condensing part to the vaporization part;
(4) mounting the wick plate in a predetermined region of the lower plate;
(5) arranging the upper plate over the lower plate in which the wick plate is mounted;
(6) coupling the upper plate with the lower plate; and
(7) injecting a liquid-phase coolant between the coupled upper plate and the lower plate,
the method further comprising forming a material layer of a different material from the material of the upper plate on the inner surface of the upper plate.

120. The method of claim 119, further comprising forming a material layer of a different material from the material of the lower plate on the entire surface of the lower plate, facing the upper plate.

121. A method of fabricating a substantially flat heat transferring device which includes a vaporization part where a liquid-phase coolant is vaporized and a condensing part where vapor generated in the vaporization part condenses into liquid, the liquid-phase coolant moving from the condensing part to the vaporization part by capillary force, the method comprising:
(1) forming lower plate, the bottom surface of which contacts a heat source;
(2) forming an upper plate corresponding to the lower plate so that a vapor moving space can be formed between elements mounted in the lower plate and the upper plate when coupling the lower plate with the upper plate;

(3) forming a wick plate having a plurality of planar wicks and a plurality of holes for making the liquid-phase coolant move from the condensing part to the vaporization part;

(4) mounting the wick plate in a predetermined region of the lower plate;

(5) arranging the upper plate over the lower plate in which the wick plate is mounted;

(6) coupling the upper plate with the lower plate; and (7) injecting a liquid-phase coolant between the coupled upper plate and the lower plate, the method further comprising forming a material layer of a different material from the material of the lower plate on the entire surface of the lower plate, facing the upper plate.

* * * * *